(12) United States Patent
Meng et al.

(10) Patent No.: US 9,185,800 B2
(45) Date of Patent: Nov. 10, 2015

(54) LASER DIRECT STRUCTURING MATERIALS WITH IMPROVED PLATING PERFORMANCE AND ACCEPTABLE MECHANICAL PROPERTIES

(71) Applicant: SABIC Global Technologies B.V., Bergen op Zoom (NL)

(72) Inventors: Jiru Meng, Shanghai (CN); David Zou, Shanghai (CN); Qiang Ji, Shanghai (CN)

(73) Assignee: SABIC Global Technologies B.V., Bergen op Zoom (NL)

( * ) Notice: Subject to any disclaimer, the term of this patent is extended or adjusted under 35 U.S.C. 154(b) by 0 days.

(21) Appl. No.: 13/621,760

(22) Filed: Sep. 17, 2012

(65) Prior Publication Data

US 2014/0076616 A1      Mar. 20, 2014

(51) Int. Cl.
| | | |
|---|---|---|
| *C08L 69/00* | (2006.01) | |
| *H05K 1/03* | (2006.01) | |
| *B29C 67/24* | (2006.01) | |

(52) U.S. Cl.
CPC .............. *H05K 1/0353* (2013.01); *B29C 67/24* (2013.01); *C08L 69/00* (2013.01); *Y10T 428/2982* (2015.01)

(58) Field of Classification Search
USPC ............................ 525/67; 174/255; 524/451
See application file for complete search history.

(56) References Cited

U.S. PATENT DOCUMENTS

| | | | |
|---|---|---|---|
| 4,603,166 A | 7/1986 | Poppe et al. | |
| 4,617,342 A | 10/1986 | Poppe et al. | |
| 4,806,297 A | 2/1989 | Brown et al. | |
| 5,130,076 A * | 7/1992 | Blatz et al. | 264/540 |
| 6,028,134 A | 2/2000 | Zhang et al. | |
| 6,881,291 B2 | 4/2005 | Platz | |
| 7,083,848 B2 | 8/2006 | Kliesch et al. | |
| 7,105,223 B2 | 9/2006 | Kliesch et al. | |
| 7,223,807 B2 | 5/2007 | Okamoto et al. | |
| 7,504,150 B2 | 3/2009 | Lee et al. | |
| 7,786,246 B2 | 8/2010 | Jansen et al. | |
| 2007/0135568 A1 * | 6/2007 | Eckel et al. | 525/63 |
| 2008/0171181 A1 | 7/2008 | Zaderej | |
| 2011/0251326 A1 * | 10/2011 | Van Hartingsveldt et al. | 524/430 |
| 2013/0203911 A1 * | 8/2013 | Kulkarni et al. | 524/153 |

FOREIGN PATENT DOCUMENTS

| | | |
|---|---|---|
| EP | 121983 A2 | 10/1984 |
| EP | 121984 A2 | 10/1984 |
| EP | 121985 A2 | 10/1984 |
| EP | 122688 A2 | 10/1984 |
| EP | 395414 A1 | 10/1990 |
| WO | WO-2009024496 A2 | 2/2009 |
| WO | WO-2010/006226 A1 | 1/2010 |
| WO | WO-2012/056385 A1 | 5/2012 |

OTHER PUBLICATIONS

International Search Report issued Feb. 18, 2014 by the International Searching Authority for PCT Application PCT/IB2013/058622 filed Sep. 17, 2013 (Inventor—Jiru Meng // Applicant—SABIC Innovative Plastics IP, B.V.) (5 pages).

Written Opinion issued Feb. 18, 2014 by the International Searching Authority for PCT Application PCT/IB2013/058622 filed Sep. 17, 2013 (Inventor—Jiru Meng // Applicant—SABIC Innovative Plastics IP, B.V.) (5 pages).

* cited by examiner

*Primary Examiner* — Jeffrey Mullis
(74) *Attorney, Agent, or Firm* — Baker Hostetler LLP

(57) ABSTRACT

The disclosure relates to blended thermoplastic compositions, and in one aspect to blended thermoplastic compositions comprising a polycarbonate polymer and a high rubber graft acrylonitrile-butadiene-styrene polymer blend, a styrene-acrylonitrile copolymer, and a laser direct structuring additive. These blended thermoplastic compositions are capable of being used in a laser direct structuring process. The present invention also relates to methods of manufacturing these compositions and articles that include these compositions.

37 Claims, 4 Drawing Sheets

LASER DIRECT STRUCTURING MATERIALS WITH IMPROVED PLATING PERFORMANCE AND ACCEPTABLE MECHANICAL PROPERTIES

FIELD OF INVENTION

The present invention relates to blended thermoplastic compositions, and in one aspect to blended thermoplastic compositions capable of being used in a laser direct structuring process. The present invention also relates to methods of manufacturing these compositions and articles that include these compositions.

BACKGROUND

Electrical components can be provided as molded injection devices (MID) with desired printed conductors, e.g., when manufactured in MID technology, using different methods, e.g., a masking method, in two-component injection molding with subsequent electroplating (or electroless plating), because for some cases, chemical plating is used for 2-component injection molding. In contrast to conventional circuit boards made of fiberglass-reinforced plastic or the like, MID components manufactured in this way are three-dimensional molded parts having an integrated printed conductor layout and possibly further electronic or electromechanical components. The use of MID components of this type, even if the components have only printed conductors and are used to replace conventional wiring inside an electrical or electronic device, saves space, allowing the relevant device to be made smaller, and lowers the manufacturing costs by reducing the number of assembly and contacting steps. These MID devices have great utility in cell phones, PDAs and notebook applications.

Stamp metal, flexible printed circuit board (FPCB) mounted and two-shot molding methods are three existing technologies to make an MID. However, stamping and FPCB mounted process have limitations in the pattern geometry, and the tooling is expensive and also altering of a RF pattern causes high-priced and time-consuming modifications into tooling. 2-shot-molding (two-component injection molding) processes have been used to produce 3D-MIDs with real three-dimensional structures. The antenna can be formed with subsequent chemical corrosion, chemical surface activation and selective metal coating. This method involves high initial costs and is only economically viable for large production numbers. 2-shot-molding is also not environmentally friendly process. All these three methods are tool-based technologies, which have limited flexibility, long development cycles, difficult prototype, expensive design changes, and limited miniaturization.

Accordingly, it is becoming increasingly popular to form MIDs using a laser direct structuring (LDS) process. In an LDS process a computer-controlled laser beam travels over the MID to activate the plastic surface at locations where the conductive path is to be situated. With a laser direct structuring process, it is possible to obtain small conductive path widths (such as of 150 microns or less). In addition, the spacing between the conductive paths can also be small. As a result, MIDs formed from this process save space and weight in the end-use applications. Another advantage of laser direct structuring is its flexibility. If the design of the circuit is changed, it is simply a matter of reprogramming the computer that controls the laser.

SUMMARY

In one aspect, the invention relates to blended thermoplastic compositions comprising a thermoplastic base resin, a laser direct structuring additive, and a mineral filler. The disclosed blended thermoplastic compositions are capable of being used in a laser direct structuring (LDS) process and that provide enhanced plating performance while exhibiting good mechanical properties. In various further aspects, the thermoplastic base resin of the blended thermoplastic composition comprises an acrylonitrile-butadiene-styrene (ABS). In a further aspect, the ABS is a high rubber graft ABS (also referred to as a HRG ABS). The present invention also relates to methods of manufacturing these compositions and articles that include these compositions.

Disclosed are blended thermoplastic compositions comprising: a) a polymer blend comprising: i) a polycarbonate polymer in an amount from about 40 wt % to about 70 wt %; and ii) a high rubber graft acrylonitrile-butadiene-styrene (HRG-ABS) copolymer in an amount from about 10 wt % to about 25 wt %; b) a styrene-acrylonitrile (SAN) copolymer in an amount from about 5 wt % to about 30 wt %; and c) a laser direct structuring (LDS) additive in an amount from about 5 wt % to about 15 wt %; wherein the compound is capable of being plated after being activated with a laser and exhibits a mechanical strength greater than about 400 J/m.

Also disclosed are methods of improving plating performance of a blended thermoplastic compostion, the method comprising the step of combining: a) a polymer blend comprising: i) a polycarbonate polymer in an amount from about 40 wt % to about 70 wt %; and ii) a high rubber graft acrylonitrile-butadiene-styrene (HRG-ABS) copolymer in an amount from about 10 wt % to about 25 wt %; b) a styrene-acrylonitrile (SAN) copolymer in an amount from about 5 wt % to about 30 wt %; and c) a laser direct structuring (LDS) additive in an amount from about 5 wt % to about 15 wt %; wherein the blended thermoplastic composition is capable of being plated after being activated with a laser and exhibits a mechanical strength greater than about 400 J/m.

Also disclosed are methods of improving plating performance of a blended thermoplastic compostion, the method comprising the steps of: a) preparing a blended thermoplastic composition by combining: i) a polymer blend comprising: 1) a polycarbonate polymer in an amount from about 40 wt % to about 70 wt %; and 2) a high rubber graft acrylonitrile-butadiene-styrene (HRG-ABS) copolymer in an amount from about 10 wt % to about 25 wt %; ii) a styrene-acrylonitrile (SAN) copolymer in an amount from about 5 wt % to about 30 wt %; and iii) a laser direct structuring (LDS) additive in an amount from about 5 wt % to about 15 wt %; b) molding an article from the blended thermoplastic composition; c) using a laser to form a conductive path on the molded article; d) plating a metal layer onto the conductive path; wherein the molded article exhibits a mechanical strength greater than about 400 J/m.

Also disclosed are extruded or injection molded articles, comprising the product of extrusion molding or injection molding a composition comprising: a) a polymer blend comprising: i) a polycarbonate polymer in an amount from about 40 wt % to about 70 wt %; and ii) a high rubber graft acrylonitrile-butadiene-styrene (HRG-ABS) copolymer in an amount from about 10 wt % to about 25 wt %; b) a styrene-acrylonitrile (SAN) copolymer in an amount from about 5 wt % to about 30 wt %; and c) a laser direct structuring (LDS) additive in an amount from about 5 wt % to about 15 wt %; wherein the article is capable of being plated after being activated with a laser and exhibits a mechanical strength greater than about 400 J/m.

Also disclosed are articles of manufacture comprising a molded article having a conductive path thereon; and a metal layer plated on the conductive path; wherein the molded article is formed from a composition comprising: a) a polymer blend comprising: i) a polycarbonate polymer in an amount from about 40 wt % to about 70 wt %; and ii) a high rubber graft acrylonitrile-butadiene-styrene (HRG-ABS) copolymer in an amount from about 10 wt % to about 25 wt %; b) a styrene-acrylonitrile (SAN) copolymer in an amount from about 5 wt % to about 30 wt %; and c) a laser direct structuring (LDS) additive in an amount from about 5 wt % to about 15 wt %; wherein the molded article exhibits a mechanical strength greater than about 400 J/m; and wherein the LDS additive is activated with a laser.

While aspects of the present invention can be described and claimed in a particular statutory class, such as the system statutory class, this is for convenience only and one of skill in the art will understand that each aspect of the present invention can be described and claimed in any statutory class. Unless otherwise expressly stated, it is in no way intended that any method or aspect set forth herein be construed as requiring that its steps be performed in a specific order. Accordingly, where a method claim does not specifically state in the claims or descriptions that the steps are to be limited to a specific order, it is in no way intended that an order be inferred, in any respect. This holds for any possible non-express basis for interpretation, including matters of logic with respect to arrangement of steps or operational flow, plain meaning derived from grammatical organization or punctuation, or the number or type of aspects described in the specification.

BRIEF DESCRIPTION OF THE DRAWINGS

The accompanying drawings are incorporated and illustrate exemplary aspect(s) of the disclosure and together with the description and claims appended hereto serve to explain various principles, features, or aspects of the subject disclosure.

Figure 1:
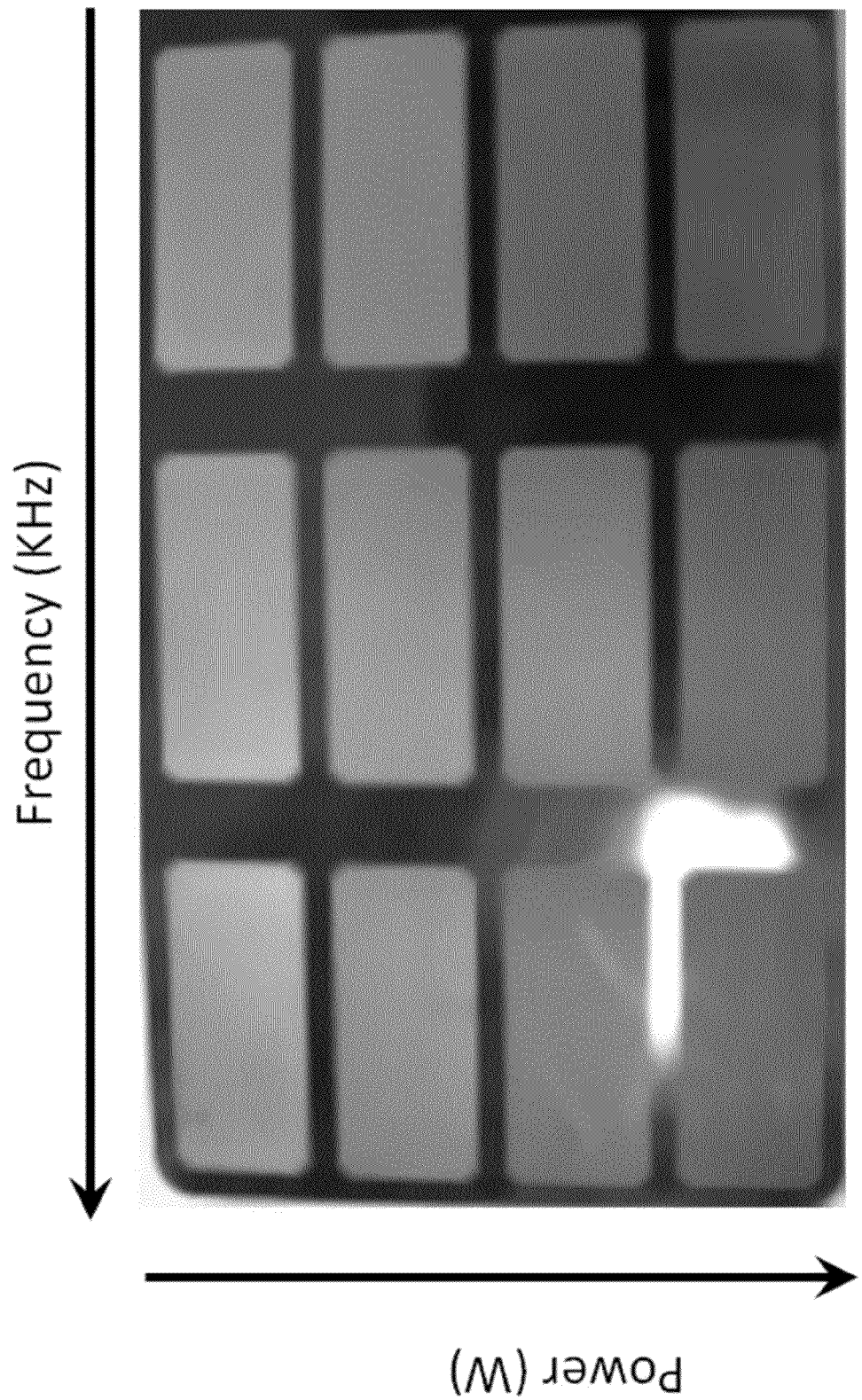
FIG. 1 shows representative data on the plating performance of representative compositions in accordance with one or more aspects of the disclosure. The representative samples at plated at varied at different conditions (frequency (f) and power (P)) as indicated by the arrows in the figure and the samples utilize a composition having a plating ranking equal to zero.

Additional advantages of the invention will be set forth in part in the description which follows, and in part will be obvious from the description, or can be learned by practice of the invention. The advantages of the invention will be realized and attained by means of the elements and combinations particularly pointed out in the appended claims. It is to be understood that both the foregoing general description and the following detailed description are exemplary and explanatory only and are not restrictive of the invention, as claimed.

DETAILED DESCRIPTION

The present invention can be understood more readily by reference to the following detailed description of the invention and the Examples included therein.

Before the present compounds, compositions, articles, systems, devices, and/or methods are disclosed and described, it is to be understood that they are not limited to specific synthetic methods unless otherwise specified, or to particular reagents unless otherwise specified, as such can, of course, vary. It is also to be understood that the terminology used herein is for the purpose of describing particular aspects only and is not intended to be limiting. Although any methods and materials similar or equivalent to those described herein can be used in the practice or testing of the present invention, example methods and materials are now described.

Moreover, it is to be understood that unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; and the number or type of aspects described in the specification.

All publications mentioned herein are incorporated herein by reference to disclose and describe the methods and/or materials in connection with which the publications are cited.

Definitions

Unless defined otherwise, all technical and scientific terms used herein have the same meaning as commonly understood by one of ordinary skill in the art to which this invention belongs. Although any methods and materials similar or equivalent to those described herein can be used in the practice or testing of the present invention, example methods and materials are now described.

As used in the specification and the appended claims, the singular forms "a," "an" and "the" include plural referents unless the context clearly dictates otherwise Ranges can be expressed herein as from one particular value, and/or to another particular value. When such a range is expressed, another aspect includes from the one particular value and/or to the other particular value. Similarly, when values are expressed as approximations, by use of the antecedent 'about,' it will be understood that the particular value forms another aspect. It will be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. It is also understood that each unit between two particular units are also disclosed. For example, if 10 and 15 are disclosed, then 11, 12, 13, and 14 are also disclosed.

As used herein, the terms "about" and "at or about" mean that the amount or value in question can be the value designated some other value approximately or about the same. It is generally understood, as used herein, that it is the nominal value indicated ±10% variation unless otherwise indicated or inferred. The term is intended to convey that similar values promote equivalent results or effects recited in the claims. That is, it is understood that amounts, sizes, formulations, parameters, and other quantities and characteristics are not and need not be exact, but can be approximate and/or larger or smaller, as desired, reflecting tolerances, conversion factors, rounding off, measurement error and the like, and other factors known to those of skill in the art. In general, an amount, size, formulation, parameter or other quantity or characteristic is "about" or "approximate" whether or not expressly stated to be such. It is understood that where "about" is used before a quantitative value, the parameter also includes the specific quantitative value itself, unless specifically stated otherwise.

As used herein, the terms "optional" or "optionally" means that the subsequently described event or circumstance can or can not occur, and that the description includes instances where said event or circumstance occurs and instances where it does not. For example, the phrase "optionally substituted alkyl" means that the alkyl group can or can not be substituted and that the description includes both substituted and unsubstituted alkyl groups.

Throughout the description and claims of this specification, the word "comprise" and variations of the word, such as "comprising" and "comprises," means "including but not limited to," and is not intended to exclude, for example, other additives, components, integers or steps. "Exemplary" means "an example of" and is not intended to convey an indication of a preferred or ideal aspect. "Such as" is not used in a restrictive sense, but for explanatory purposes.

Disclosed are the components to be used to prepare the compositions of the invention as well as the compositions themselves to be used within the methods disclosed herein. These and other materials are disclosed herein, and it is understood that when combinations, subsets, interactions, groups, etc. of these materials are disclosed that while specific reference of each various individual and collective combinations and permutation of these compounds can not be explicitly disclosed, each is specifically contemplated and described herein. For example, if a particular compound is disclosed and discussed and a number of modifications that can be made to a number of molecules including the compounds are discussed, specifically contemplated is each and every combination and permutation of the compound and the modifications that are possible unless specifically indicated to the contrary. Thus, if a class of molecules A, B, and C are disclosed as well as a class of molecules D, E, and F and an example of a combination molecule, A-D is disclosed, then even if each is not individually recited each is individually and collectively contemplated meaning combinations, A-E, A-F, B-D, B-E, B-F, C-D, C-E, and C-F are considered disclosed. Likewise, any subset or combination of these is also disclosed. Thus, for example, the sub-group of A-E, B-F, and C-E would be considered disclosed. This concept applies to all aspects of this application including, but not limited to, steps in methods of making and using the compositions of the invention. Thus, if there are a variety of additional steps that can be performed it is understood that each of these additional steps can be performed with any specific aspect or combination of aspects of the methods of the invention.

References in the specification and concluding claims to parts by weight, of a particular element or component in a composition or article, denotes the weight relationship between the element or component and any other elements or components in the composition or article for which a part by weight is expressed. Thus, in a compound containing 2 parts by weight of component X and 5 parts by weight component Y, X and Y are present at a weight ratio of 2:5, and are present in such ratio regardless of whether additional components are contained in the compound.

A weight percent of a component, unless specifically stated to the contrary, is based on the total weight of the formulation or composition in which the component is included. For example if a particular element or component in a composition or article is said to have 8% weight, it is understood that this percentage is relation to a total compositional percentage of 100%.

The term "alkyl group" as used herein is a branched or unbranched saturated hydrocarbon group of 1 to 24 carbon atoms, such as methyl, ethyl, n-propyl, isopropyl, n-butyl, isobutyl, t-butyl, pentyl, hexyl, heptyl, octyl, decyl, tetradecyl, hexadecyl, eicosyl, tetracosyl and the like. A "lower alkyl" group is an alkyl group containing from one to six carbon atoms.

The term "alkoxy" as used herein is an alkyl group bound through a single, terminal ether linkage; that is, an "alkoxy" group can be defined as —OR where R is alkyl as defined above. A "lower alkoxy" group is an alkoxy group containing from one to six carbon atoms.

The term "alkenyl group" as used herein is a hydrocarbon group of from 2 to 24 carbon atoms and structural formula containing at least one carbon-carbon double bond. Asymmetric structures such as (AB)C=C(CD) are intended to include both the E and Z isomers. This can be presumed in structural formulae herein wherein an asymmetric alkene is present, or it can be explicitly indicated by the bond symbol C.

The term "alkynyl group" as used herein is a hydrocarbon group of 2 to 24 carbon atoms and a structural formula containing at least one carbon-carbon triple bond.

The term "aryl group" as used herein is any carbon-based aromatic group including, but not limited to, benzene, naphthalene, etc. The term "aromatic" also includes "heteroaryl group," which is defined as an aromatic group that has at least one heteroatom incorporated within the ring of the aromatic group. Examples of heteroatoms include, but are not limited to, nitrogen, oxygen, sulfur, and phosphorus. The aryl group can be substituted or unsubstituted. The aryl group can be substituted with one or more groups including, but not limited to, alkyl, alkynyl, alkenyl, aryl, halide, nitro, amino, ester, ketone, aldehyde, hydroxy, carboxylic acid, or alkoxy.

The term "cycloalkyl group" as used herein is a non-aromatic carbon-based ring composed of at least three carbon atoms. Examples of cycloalkyl groups include, but are not limited to, cyclopropyl, cyclobutyl, cyclopentyl, cyclohexyl, etc. The term "heterocycloalkyl group" is a cycloalkyl group as defined above where at least one of the carbon atoms of the ring is substituted with a heteroatom such as, but not limited to, nitrogen, oxygen, sulphur, or phosphorus.

The term "aralkyl" as used herein is an aryl group having an alkyl, alkynyl, or alkenyl group as defined above attached to the aromatic group. An example of an aralkyl group is a benzyl group.

The term "hydroxyalkyl group" as used herein is an alkyl, alkenyl, alkynyl, aryl, aralkyl, cycloalkyl, halogenated alkyl, or heterocycloalkyl group described above that has at least one hydrogen atom substituted with a hydroxyl group.

The term "alkoxyalkyl group" is defined as an alkyl, alkenyl, alkynyl, aryl, aralkyl, cycloalkyl, halogenated alkyl, or heterocycloalkyl group described above that has at least one hydrogen atom substituted with an alkoxy group described above.

The term "ester" as used herein is represented by the formula —C(O)OA, where A can be an alkyl, halogenated alkyl, alkenyl, alkynyl, aryl, heteroaryl, cycloalkyl, cycloalkenyl, heterocycloalkyl, or heterocycloalkenyl group described above.

The term "carbonate group" as used herein is represented by the formula —OC(O)OR, where R can be hydrogen, an alkyl, alkenyl, alkynyl, aryl, aralkyl, cycloalkyl, halogenated alkyl, or heterocycloalkyl group described above.

The term "carboxylic acid" as used herein is represented by the formula —C(O)OH.

The term "aldehyde" as used herein is represented by the formula —C(O)H.

The term "keto group" as used herein is represented by the formula —C(O)R, where R is an alkyl, alkenyl, alkynyl, aryl, aralkyl, cycloalkyl, halogenated alkyl, or heterocycloalkyl group described above.

The term "carbonyl group" as used herein is represented by the formula C=O.

The term "ether" as used herein is represented by the formula AOA$^1$, where A and A$^1$ can be, independently, an alkyl, halogenated alkyl, alkenyl, alkynyl, aryl, heteroaryl, cycloalkyl, cycloalkenyl, heterocycloalkyl, or heterocycloalkenyl group described above.

The term "sulfo-oxo group" as used herein is represented by the formulas —S(O)$_2$R, —OS(O)$_2$R, or, —OS(O)$_2$OR, where R can be hydrogen, an alkyl, alkenyl, alkynyl, aryl, aralkyl, cycloalkyl, halogenated alkyl, or heterocycloalkyl group described above.

As used herein, the terms "number average molecular weight" or "Mn" can be used interchangeably, and refer to the statistical average molecular weight of all the polymer chains in the sample and is defined by the formula:

$$Mn = \frac{\sum N_i M_i}{\sum N_i},$$

where $M_i$ is the molecular weight of a chain and $N_i$ is the number of chains of that molecular weight. Mn can be determined for polymers, such as polycarbonate polymers or polycarbonate-PMMA copolymers, by methods well known to a person having ordinary skill in the art. It is to be understood that as used herein, Mn is measured gel permeation chromatography and as calibrated with polycarbonate standards. For example, gel permeation chromatography can be carried out using a crosslinked styrene-divinyl benzene column, at a sample concentration of 1 milligram per milliliter with appropriate mobile phase solvents.

As used herein, the terms "weight average molecular weight" or "Mw" can be used interchangeably, and are defined by the formula:

$$Mw = \frac{\sum N_i M_i^2}{\sum N_i M_i},$$

where $M_i$ is the molecular weight of a chain and $N_i$ is the number of chains of that molecular weight. Compared to Mn, Mw takes into account the molecular weight of a given chain in determining contributions to the molecular weight average. Thus, the greater the molecular weight of a given chain, the more the chain contributes to the Mw. It is to be understood that as used herein, Mw is measured gel permeation chromatography. In some cases, Mw is measured gel permeation chromatography and calibrated with polycarbonate standards. Gel permeation chromatography can be carried out using a crosslinked styrene-divinyl benzene column, at a sample concentration of about 1 milligram per milliliter with appropriate mobile phase solvents.

As used herein, the terms "polydispersity index" or "PDI" can be used interchangeably, and are defined by the formula:

$$PDI = \frac{Mw}{Mn}.$$

The PDI has a value equal to or greater than 1, but as the polymer chains approach uniform chain length, the PDI approaches unity.

The terms "polycarbonate" or "polycarbonates" as used herein includes copolycarbonates, homopolycarbonates and (co)polyester carbonates.

The terms "residues" and "structural units", used in reference to the constituents of the polymers, are synonymous throughout the specification.

Each of the materials disclosed herein are either commercially available and/or the methods for the production thereof are known to those of skill in the art.

It is understood that the compositions disclosed herein have certain functions. Disclosed herein are certain structural requirements for performing the disclosed functions, and it is understood that there are a variety of structures that can perform the same function that are related to the disclosed structures, and that these structures will typically achieve the same result.

Blended Thermoplastic Compositions

As briefly described above, the present invention, provides in one aspect, blended thermoplastic compositions comprising a thermoplastic base resin, a laser direct structuring additive, and a mineral filler. The disclosed blended thermoplastic compositions are capable of being used in a laser direct structuring (LDS) process and that provide enhanced plating performance while exhibiting good mechanical properties. In various further aspects, the thermoplastic base resin of the blended thermoplastic composition comprises an acrylonitrile-butadiene-styrene (ABS). In a further aspect, the ABS is a high rubber graft ABS (also referred to as a HRG ABS).

Laser direct structuring technology provides a new way to make track structures arranged on a nonconductive material serving as antenna. Compared to the existing methods such as metal sheet stamping and 2-shot-molding, LDS realized the short development cycles, variation of design, cost reduction, miniaturization, diversification and functionality of the antenna, which is pushed by the market trend. LDS throws out the 2-shot-molding and enables MID blanks to be produced by single component injection molding. This single component contains laser activatable additives, which form metal clusters on the area where laser etched. During the following plating process, antenna designed can be formed. However, due to different chemical plating solutions/conditions used, the plating performance of LDS materials varies obviously, such as plating rate, adhesion of plating layers even with same LDS material.

Accordingly, it would be beneficial to provide a LDS blended thermoplastic composition (or LDS compound) having good plating performance while maintaining good mechanical performance. It would also be beneficial to provide a LDS blended thermoplastic composition that is capable of being used in various applications due to the ability of the composition to provide good mechanical performance. It would also be beneficial to provide a thermoplastic composition that is capable of being used in a laser direct structuring process.

As described in greater detail below, in one aspect, the disclosure relates to thermoplastic compounds that are capable of being used in a laser direct structuring (LDS) process and that provide enhanced plating performance while exhibiting good mechanical properties. The compositions include a thermoplastic base resin, a laser direct structuring additive, and a mineral filler. In certain aspects, blended thermoplastic compositions comprising a high rubber graft (HRG) type of acrylonitrile-butadiene-styrene (ABS) instead of bulk ABS, plating performance (e.g., plating rate) the blended thermoplastic compositions and molded parts formed of blended polycarbonate (PC)/ABS based LDS compounds is improved with respect to LDS compounds having bulk ABS. In one aspect, higher loading of HRG ABS yields higher plating rate, e.g., plating rates with B % greater than about 18%. In other aspects, addition of a mineral filler, such as a silicate mineral filler, into a blended thermoplastic composition of the disclosure can yield an LDS compound having improved plating performance (e.g., higher plating rate than non-mineralized compounds). Loading of mineral filler the LDS compounds in such aspects ranges from about 3 wt % to about 5 wt %. In one aspect, addition of the mineral filler in the compounds can yield a two-fold increase in plating performance while maintaining mechanical properties of the compound similar to those compounds not having the mineral filler.

Accordingly, in one aspect, the thermoplastic compositions of the present disclosure use a thermoplastic resin as the base for the composition. Examples of thermoplastic resins that can be used in the present disclosure include, but are not limited to, polycarbonate or a polycarbonate/acrylonitrile-butadiene-styrene resin blend; a poly(arylene ether) resin, such as a polyphenylene oxide resin, a nylon-based resin such as a polyphthalamide resin, or a combination including at least one of the foregoing resins.

Without intent to be bound by theory, modeling, and/or experiment, it is believed that the improved plating performance (e.g., plating rate) arises from surface roughness and effective metal seeds present on the surface of the thermoplastic resin after treatment (e.g., blending) with rubber. In one aspect, the plating performance (e.g., plating rate) of molded parts formed of LDS compounds having blended polycarbonate (PC)/ABS, with the treated ABS, is improved with respect to LDS compounds having bulk ABS.

The blended thermoplastic compositions (or compounds) of the disclosure can be used in a variety of applications such as personal computers, notebook and portable computers, cell phone antennas and other such communications equipment, medical applications, RFID applications, and automotive applications.

In various aspects, the present invention relates to blended thermoplastic compositions, comprising: a) a polymer blend comprising: i) a polycarbonate polymer in an amount from about 40 wt % to about 70 wt %; and ii) a high rubber graft acrylonitrile-butadiene-styrene (HRG-ABS) copolymer in an amount from about 10 wt % to about 25 wt %; b) a styrene-acrylonitrile (SAN) copolymer in an amount from about 5 wt % to about 30 wt %; and c) a laser direct structuring (LDS) additive in an amount from about 5 wt % to about 15 wt %; wherein the composition is capable of being plated after being activated with a laser and exhibits a mechanical strength greater than about 400 J/m.

In a further aspect, the blend thermoplastic composition comprises a polymer blend comprising a polycarbonate polymer present in an amount from about 40 wt % to about 60 wt %. In a still further aspect, the blend thermoplastic composition comprises a polymer blend comprising a polycarbonate polymer present in an amount from about 40 wt % to about 50 wt %. In a yet further aspect, the blend thermoplastic composition comprises a polymer blend comprising a polycarbonate polymer present in an amount from about 42 wt % to about 59 wt %. In an even further aspect, the blend thermoplastic composition comprises a polymer blend comprising a polycarbonate polymer present in an amount from about 41 wt % to about 49 wt %. In a still further aspect, the blend thermoplastic composition comprises a polymer blend comprising a polycarbonate polymer present in an amount from about 44 wt % to about 49 wt %. In a yet further aspect, the blend thermoplastic composition comprises a polymer blend comprising a polycarbonate polymer present in an amount of about 44 wt %. In an even further aspect, the blend thermoplastic composition comprises a polymer blend comprising a polycarbonate polymer present in an amount of about 49 wt %.

In a further aspect, the blend thermoplastic composition comprises a polymer blend comprising a HRG ABS copolymer present in an amount from about 12 wt % to about 21 wt %. In a still further aspect, the blend thermoplastic composition comprises a polymer blend comprising a HRG ABS copolymer present in an amount from about 13 wt % to about 20 wt %. In a yet further aspect, the blend thermoplastic composition comprises a polymer blend comprising a HRG ABS copolymer present in an amount from about 14 wt % to about 19 wt %. In an even further aspect, the blend thermoplastic composition comprises a polymer blend comprising a HRG ABS copolymer present in an amount of about 14 wt %. In a still further aspect, the blend thermoplastic composition comprises a polymer blend comprising a HRG ABS copolymer present in an amount of about 19 wt %.

In a further aspect, the blend thermoplastic composition comprises a polymer blend comprising a SAN copolymer present in an amount from about 7 wt % to about 25 wt %. In a still further aspect, the blend thermoplastic composition comprises a polymer blend comprising a SAN copolymer present in an amount from about 10 wt % to about 25 wt %. In a yet further aspect, the blend thermoplastic composition comprises a polymer blend comprising a SAN copolymer present in an amount from about 12 wt % to about 22 wt %. In an even further aspect, the blend thermoplastic composition comprises a polymer blend comprising a SAN copolymer present in an amount from about 19 wt % to about 23 wt %. In a still further aspect, the blend thermoplastic composition comprises a polymer blend comprising a SAN copolymer present in an amount from about 11 wt % to about 14 wt %. In a yet further aspect, the blend thermoplastic composition comprises a polymer blend comprising a SAN copolymer present in an amount of about 22 wt %. In an even further aspect, the blend thermoplastic composition comprises a polymer blend comprising a SAN copolymer present in an amount of about 12 wt %.

In various aspects, the blended thermoplastic composition exhibits a mechanical strength greater than about 400 J/m, wherein the mechanical strength is impact strength. In a further aspect, the impact strength is notched impact strength measured in accordance with ASTM D256. In a still further aspect, the impact strength is notched impact strength measured in accordance with ASTM D256 at 23° C. using a specimen of 3.2 mm thickness.

A blended thermoplastic composition, comprising: a) a polymer blend comprising: i) a polycarbonate polymer in an amount from about 40 wt % to about 70 wt %; and ii) a high rubber graft acrylonitrile-butadiene-styrene (HRG-ABS) copolymer in an amount from about 10 wt % to about 25 wt %; b) a styrene-acrylonitrile (SAN) copolymer in an amount from about 5 wt % to about 30 wt %; c) a mineral filler in an amount from about 1 wt % to about 10 wt %; and d) a laser direct structuring (LDS) additive in an amount from about 5 wt % to about 15 wt %; the composition is capable of being plated after being activated with a laser and exhibits a mechanical strength greater than about 400 J/m.

A blended thermoplastic composition, comprising: a) a polymer blend comprising: i) a polycarbonate polymer in an amount from about 60 wt % to about 65 wt %; and ii) a high rubber graft acrylonitrile-butadiene-styrene (HRG-ABS) copolymer in an amount from about 12 wt % to about 20 wt %; b) a styrene-acrylonitrile (SAN) copolymer in an amount from about 10 wt % to about 25 wt %; c) a mineral filler comprising talc in an amount from about 2 wt % to about 6 wt %; and d) a laser direct structuring (LDS) additive comprising copper chromium oxide in an amount from about 9 wt % to about 11 wt %; the composition is capable of being plated after being activated with a laser and exhibits a mechanical strength greater than about 400 J/m.

A blended thermoplastic composition, comprising: a) a polymer blend comprising: i) a polycarbonate polymer in an amount from about 42 wt % to about 50 wt %; and ii) a high rubber graft acrylonitrile-butadiene-styrene (HRG-ABS) copolymer in an amount from about 17 wt % to about 21 wt %; b) a styrene-acrylonitrile (SAN) copolymer in an amount from about 19 wt % to about 23 wt %; c) a talc in an amount from about 2 wt % to about 5 wt %; and d) a laser direct structuring (LDS) additive comprising copper chromium oxide in an amount from about 9 wt % to about 11 wt %; the composition is capable of being plated after being activated with a laser and exhibits a mechanical strength greater than about 400 J/m.

A blended thermoplastic composition, comprising: a) a polymer blend comprising: i) a polycarbonate polymer in an amount of about 46 wt %; and ii) a high rubber graft acrylonitrile-butadiene-styrene (HRG-ABS) copolymer in an amount of 19 wt %; b) a styrene-acrylonitrile (SAN) copolymer in an amount of about 22 wt %; c) a talc in an amount of about 3 wt %; and d) a laser direct structuring (LDS) additive comprising copper chromium oxide in an amount of about 10 wt %; the composition is capable of being plated after being activated with a laser and exhibits a mechanical strength greater than about 400 J/m.

A blended thermoplastic composition, comprising: a) a polymer blend comprising: i) a polycarbonate polymer in an amount of about 44 wt %; and ii) a high rubber graft acrylonitrile-butadiene-styrene (HRG-ABS) copolymer in an amount of 19 wt %; b) a styrene-acrylonitrile (SAN) copolymer in an amount of about 22 wt %; c) a talc in an amount of about 5 wt %; and d) a laser direct structuring (LDS) additive comprising copper chromium oxide in an amount of about 10 wt %; the composition is capable of being plated after being activated with a laser and exhibits a mechanical strength greater than about 400 J/m.

A blended thermoplastic composition, comprising: a) a polymer blend comprising: i) a polycarbonate polymer in an amount of about 49 wt %; and ii) a high rubber graft acrylonitrile-butadiene-styrene (HRG-ABS) copolymer in an amount of 19 wt %; b) a styrene-acrylonitrile (SAN) copolymer in an amount of about 22 wt %; and c) a laser direct structuring (LDS) additive comprising copper chromium oxide in an amount of about 10 wt %; the composition is capable of being plated after being activated with a laser and exhibits a mechanical strength greater than about 400 J/m.

A blended thermoplastic composition, comprising: a) a polymer blend comprising: i) a polycarbonate polymer in an amount of about 64 wt %; and ii) a high rubber graft acrylonitrile-butadiene-styrene (HRG-ABS) copolymer in an amount of 14 wt %; b) a styrene-acrylonitrile (SAN) copolymer in an amount of about 12 wt %; and c) a laser direct structuring (LDS) additive comprising copper chromium oxide in an amount of about 10 wt %; the composition is capable of being plated after being activated with a laser and exhibits a mechanical strength greater than about 400 J/m.

A blended thermoplastic composition, comprising: a polymer blend comprising: i) a polycarbonate polymer in an amount of about 59 wt %; and ii) a high rubber graft acrylonitrile-butadiene-styrene (HRG-ABS) copolymer in an amount of 19 wt %; b) a styrene-acrylonitrile (SAN) copolymer in an amount of about 12 wt %; and c) a laser direct structuring (LDS) additive comprising copper chromium oxide in an amount of about 10 wt %; the composition is capable of being plated after being activated with a laser and exhibits a mechanical strength greater than about 400 J/m.

In one aspect, the invention relates to blended thermoplastic compositions, comprising from 63% by weight to 65% by weight of thermoplastic base resin treated with rubber; 21.54% by weight of a copolymer; and 3% by weight to 5% by weight of a mineral filler; wherein the composition is capable of being plated after being activated with a laser and exhibits a mechanical strength greater than about 400 J/m.

In various further aspects, the invention relates to blended thermoplastic compositions, comprising from 63% by weight to 65% by weight of thermoplastic base resin treated with rubber; 21.54% by weight of a copolymer; 10% copper chromium oxide; and 3% by weight to 5% by weight of a mineral filler; wherein the composition is capable of being plated after being activated with a laser and exhibits a mechanical strength greater than about 400 J/m.

In a further aspect, the invention relates to a method of enhancing plating performance of blended thermoplastic composition, the method comprising the step of combining, from 63% by weight to 65% by weight of thermoplastic base resin treated with rubber; 21.54% by weight of a copolymer; and 3% by weight to 5% by weight of a mineral filler; wherein the composition is capable of being plated after being activated with a laser and exhibits a mechanical strength greater than about 400 J/m.

In a further aspect, the invention relates to a method of enhancing plating performance of blended thermoplastic composition, the method comprising the step of combining: from 63% by weight to 65% by weight of thermoplastic base resin treated with rubber; 21.54% by weight of a copolymer; 10% copper chromium oxide; and 3% by weight to 5% by weight of a mineral filler; wherein the composition is capable of being plated after being activated with a laser and exhibits a mechanical strength greater than about 400 J/m.

In various further aspects, the invention relates to an extruded or injection molded article, comprising the product of extrusion molding or injection molding a composition comprising: from 63% by weight to 65% by weight of thermoplastic base resin treated with rubber; 21.54% by weight of a copolymer; and 3% by weight to 5% by weight of a mineral filler; wherein the composition is capable of being plated after being activated with a laser and exhibits a mechanical strength greater than about 400 J/m.

In a further aspect, the invention relates to an extruded or injection molded article, comprising the product of extrusion molding or injection molding a composition comprising: from 63% by weight to 65% by weight of thermoplastic base resin treated with rubber; 21.54% by weight of a copolymer; 10% copper chromium oxide; and 3% by weight to 5% by weight of a mineral filler; wherein the composition is capable of being plated after being activated with a laser and exhibits a mechanical strength greater than about 400 J/m.

Polycarbonate Polymer

As used herein, the term "polycarbonate" includes homopolycarbonates and copolycarbonates have repeating structural carbonate units. In one aspect, a polycarbonate can comprise any polycarbonate material or mixture of materials, for example, as recited in U.S. Pat. No. 7,786,246, which is hereby incorporated in its entirety for the specific purpose of disclosing various polycarbonate compositions and methods.

In one aspect, a polycarbonate, as disclosed herein, can be an aliphatic-diol based polycarbonate. In another aspect, a polycarbonate can comprise a carbonate unit derived from a dihydroxy compound, such as for example a bisphenol that differs from the aliphatic diol.

In various aspects, the polycarbonate can comprise copolymers comprising two or more distinct carbonate units. For example, a polycarbonate copolymer can comprise repeating carbonate units derived from BisAP and a second, chemically distinct dihydroxy monomer such as a bisphenol, e.g. bisphenol A. Alternatively, a polycarbonate copolymer can comprise repeating carbonate units derived from PPPBP and a second, chemically distinct dihydroxy monomer such as a bisphenol, e.g. bisphenol A.

Accordingly, in one aspect, the blended thermoplastic compositions use a polycarbonate-based resin. The polycarbonate-based resin can be selected from a polycarbonate or a resin blend that includes a polycarbonate. Accordingly, in one aspect, polycarbonates can be used as the base resin in the composition. Polycarbonates including aromatic carbonate chain units include compositions having structural units of the formula (I):

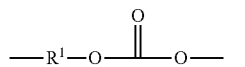

(I)

in which the $R^1$ groups are aromatic, aliphatic or alicyclic radicals. Beneficially, $R^1$ is an aromatic organic radical and, in an alternative aspect, a radical of the formula (II):

-$A^1$-$Y^1$-$A^2$- (II)

wherein each of $A^1$ and $A^2$ is a monocyclic divalent aryl radical and $Y^1$ is a bridging radical having zero, one, or two atoms which separate $A^1$ from $A^2$. In an exemplary aspect, one atom separates $A^1$ from $A^2$. Illustrative examples of radicals of this type are —O—, —S—, —S(O)—, —S(O$_2$)—, —C(O)—, methylene, cyclohexyl-methylene, 2-[2,2,1]-bicycloheptylidene, ethylidene, isopropylidene, neopentylidene, cyclohexylidene, cyclopentadecylidene, cyclododecylidene, adamantylidene, or the like. In another aspect, zero atoms separate $A^1$ from $A^2$, with an illustrative example being bisphenol. The bridging radical $Y^1$ can be a hydrocarbon group or a saturated hydrocarbon group such as methylene, cyclohexylidene or isopropylidene.

Polycarbonates can be produced by the Schotten-Bauman interfacial reaction of the carbonate precursor with dihydroxy compounds. Typically, an aqueous base such as sodium hydroxide, potassium hydroxide, calcium hydroxide, or the like, is mixed with an organic, water immiscible solvent such as benzene, toluene, carbon disulfide, or dichloromethane, which contains the dihydroxy compound. A phase transfer agent is generally used to facilitate the reaction. Molecular weight regulators can be added either singly or in admixture to the reactant mixture. Branching agents, described forthwith can also be added singly or in admixture.

Polycarbonates can be produced by the interfacial reaction polymer precursors such as dihydroxy compounds in which only one atom separates $A^1$ and $A^2$. As used herein, the term "dihydroxy compound" includes, for example, bisphenol compounds having general formula (III) as follows:

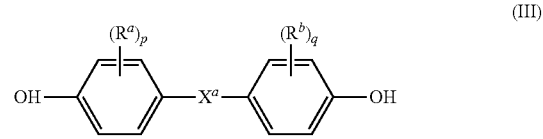

(III)

wherein $R^a$ and $R^b$ each independently represent hydrogen, a halogen atom, or a monovalent hydrocarbon group; p and q are each independently integers from 0 to 4; and $X^a$ represents one of the groups of formula (IV):

(IV)

wherein $R^c$ and $R^d$ each independently represent a hydrogen atom or a monovalent linear or cyclic hydrocarbon group, and $R^e$ is a divalent hydrocarbon group.

Examples of the types of bisphenol compounds that can be represented by formula (IV) include the bis(hydroxyaryl) alkane series such as, 1,1-bis(4-hydroxyphenyl)methane, 1,1-bis(4-hydroxyphenyl)ethane, 2,2-bis(4-hydroxyphenyl) propane (or bisphenol-A), 2,2-bis(4-hydroxyphenyl)butane, 2,2-bis(4-hydroxyphenyl)octane, 1,1-bis(4-hydroxyphenyl) propane, 1,1-bis(4-hydroxyphenyl)n-butane, bis(4-hydroxyphenyl)phenylmethane, 2,2-bis(4-hydroxy-1-methylphenyl)propane, 1,1-bis(4-hydroxy-t-butylphenyl)propane, 2,2-bis(4-hydroxy-3-bromophenyl)propane, or the like; bis (hydroxyaryl)cycloalkane series such as, 1,1-bis(4-hydroxyphenyl)cyclopentane, 1,1-bis(4-hydroxyphenyl) cyclohexane, or the like, or combinations including at least one of the foregoing bisphenol compounds.

Other bisphenol compounds that can be represented by formula (III) include those where X is —O—, —S—, —SO— or —SO$_2$—. Some examples of such bisphenol compounds are bis(hydroxyaryl)ethers such as 4,4'-dihydroxy diphenylether, 4,4'-dihydroxy-3,3'-dimethylphenyl ether, or the like; bis(hydroxy diaryl)sulfides, such as 4,4'-dihydroxy diphenyl sulfide, 4,4'-dihydroxy-3,3'-dimethyl diphenyl sulfide, or the like; bis(hydroxy diaryl)sulfoxides, such as, 4,4'-dihydroxy diphenyl sulfoxides, 4,4'-dihydroxy-3,3'-dimethyl diphenyl sulfoxides, or the like; bis(hydroxy diaryl)sulfones, such as 4,4'-dihydroxy diphenyl sulfone, 4,4'-dihydroxy-3,3'-dimethyl diphenyl sulfone, or the like; or combinations including at least one of the foregoing bisphenol compounds.

Other bisphenol compounds that can be utilized in the polycondensation of polycarbonate are represented by the formula (V)

(V)

wherein, $R^f$, is a halogen atom of a hydrocarbon group having 1 to 10 carbon atoms or a halogen substituted hydrocarbon group; n is a value from 0 to 4. When n is at least 2, R can be the same or different. Examples of bisphenol compounds that can be represented by the formula (IV), are resorcinol, substituted resorcinol compounds such as 3-methyl resorcin, 3-ethyl resorcin, 3-propyl resorcin, 3-butyl resorcin, 3-t-butyl resorcin, 3-phenyl resorcin, 3-cumyl resorcin, 2,3,4,6-tetrafloro resorcin, 2,3,4,6-tetrabromo resorcin, or the like; catechol, hydroquinone, substituted hydroquinones, such as 3-methyl hydroquinone, 3-ethyl hydroquinone, 3-propyl hydroquinone, 3-butyl hydroquinone, 3-t-butyl hydroquinone, 3-phenyl hydroquinone, 3-cumyl hydroquinone, 2,3,5,6-tetramethyl hydroquinone, 2,3,5,6-tetra-t-butyl hydroquinone, 2,3,5,6-tetrafloro hydroquinone, 2,3,5,6-tetrabromo hydroquinone, or the like; or combinations including at least one of the foregoing bisphenol compounds.

Bisphenol compounds such as 2,2,2',2'-tetrahydro-3,3,3', 3'-tetramethyl-1,1'-spirobi-[IH-indene]-6,6'-diol represented by the following formula (VI) can also be used.

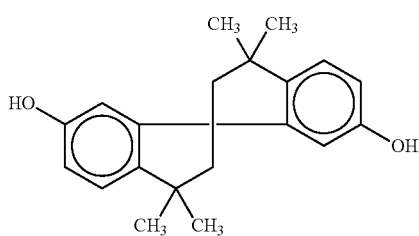
(VI)

In one aspect, the bisphenol compound is bisphenol A.

Typical carbonate precursors include the carbonyl halides, for example carbonyl chloride (phosgene), and carbonyl bromide; the bis-haloformates, for example, the bis-haloformates of dihydric phenols such as bisphenol A, hydroquinone, or the like, and the bis-haloformates of glycols such as ethylene glycol and neopentyl glycol; and the diaryl carbonates, such as diphenyl carbonate, di(tolyl) carbonate, and di(naphthyl) carbonate. In one aspect, the carbonate precursor for the interfacial reaction is carbonyl chloride.

It is also possible to employ polycarbonates resulting from the polymerization of two or more different dihydric phenols or a copolymer of a dihydric phenol with a glycol or with a hydroxy- or acid-terminated polyester or with a dibasic acid or with a hydroxy acid or with an aliphatic diacid in the event a carbonate copolymer rather than a homopolymer is selected for use. Generally, useful aliphatic diacids have about 2 to about 40 carbons. A beneficial aliphatic diacid is dodecanedioic acid.

Branched polycarbonates, as well as blends of linear polycarbonate and a branched polycarbonate can also be used in the composition. The branched polycarbonates can be prepared by adding a branching agent during polymerization. These branching agents can include polyfunctional organic compounds containing at least three functional groups, which can be hydroxyl, carboxyl, carboxylic anhydride, haloformyl, and combinations including at least one of the foregoing branching agents. Specific examples include trimellitic acid, trimellitic anhydride, trimellitic trichloride, tris-p-hydroxy phenyl ethane, isatin-bis-phenol, tris-phenol TC (1,3,5-tris ((p-hydroxyphenyl)isopropyl)benzene), tris-phenol PA (4(4 (1,1-bis(p-hydroxyphenyl)-ethyl) α,α-dimethyl benzyl)phenol), 4-chloroformyl phthalic anhydride, trimesic acid, benzophenone tetracarboxylic acid, or the like, or combinations including at least one of the foregoing branching agents. The branching agents can be added at a level of about 0.05 to about 2.0 weight percent (wt %), based upon the total weight of the polycarbonate in a given layer.

In one aspect, the polycarbonate can be produced by a melt polycondensation reaction between a dihydroxy compound and a carbonic acid diester. Examples of the carbonic acid diesters that can be utilized to produce the polycarbonates are diphenyl carbonate, bis(2,4-dichlorophenyl)carbonate, bis(2, 4,6-trichlorophenyl) carbonate, bis(2-cyanophenyl) carbonate, bis(o-nitrophenyl) carbonate, ditolyl carbonate, m-cresyl carbonate, dinaphthyl carbonate, bis(diphenyl) carbonate, bis (methylsalicyl)carbonate, diethyl carbonate, dimethyl carbonate, dibutyl carbonate, dicyclohexyl carbonate, or the like, or combinations including at least one of the foregoing carbonic acid diesters. In one aspect, the carbonic acid diester is diphenyl carbonate or bis(methylsalicyl)carbonate.

Beneficially, the number average molecular weight of the polycarbonate is 3,000 to 1,000,000 grams/mole (g/mole). Within this range, it is beneficial to have a number average molecular weight of greater than or equal to 10,000 in one aspect, greater than or equal to 20,000 in another aspect, and greater than or equal to 25,000 g/mole in yet another aspect. Also beneficial is a number average molecular weight of less than or equal to 100,000 in one aspect, less than or equal to 75,000 in an alternative aspect, less than or equal to 50,000 in still another alternative aspect, and less than or equal to 35,000 g/mole in yet another alternative aspect.

In another aspect, the polycarbonate-based resin used in the thermoplastic composition includes a polycarbonate resin blend, such that a polycarbonate is blended with another resin. In one aspect, the polycarbonate-based resin includes a blend of a polycarbonate with a polystyrene polymer. Examples include polycarbonate/acrylonitrile-butadiene-styrene resin blends. The term "polystyrene" as used herein includes polymers prepared by bulk, suspension and emulsion polymerization, which contain at least 25% by weight of polymer precursors having structural units derived from a monomer of the formula (VII):

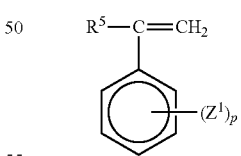
(VII)

wherein $R^5$ is hydrogen, lower alkyl or halogen; $Z^1$ is vinyl, halogen or lower alkyl; and p is from 0 to about 5. These organic polymers include homopolymers of styrene, chlorostyrene and vinyltoluene, random copolymers of styrene with one or more monomers illustrated by acrylonitrile, butadiene, alpha-methylstyrene, ethylvinylbenzene, divinylbenzene and maleic anhydride, and rubber-modified polystyrenes including blends and grafts, wherein the rubber is a polybutadiene or a rubbery copolymer of about 98 to about 70 wt % styrene and about 2 to about 30 wt % diene monomer. Polystyrenes are miscible with polyphenylene ether in all proportions, and any such blend can contain polystyrene in amounts of about 5 to about 95 wt % and most often about 25 to about 75 wt %, based on the total weight of the polymers.

In a further aspect, the polycarbonate polymer is present in an amount from about 40 wt % to about 60 wt %. In a still further aspect, the polycarbonate polymer is present in an amount from about 40 wt % to about 50 wt %. In a yet further aspect, the polycarbonate polymer is present in an amount from about 42 wt % to about 59 wt %. In an even further aspect, the polycarbonate polymer is present in an amount from about 41 wt % to about 49 wt %. In a still further aspect, the polycarbonate polymer is present in an amount from about 44 wt % to about 49 wt %. In a yet further aspect, the polycarbonate polymer is present in an amount of about 44 wt %. In an even further aspect, the polycarbonate polymer is present in an amount of about 49 wt %.

Polyamide Polymer

In an alternative aspect, the thermoplastic compositions of the present disclosure include a nylon-based resin, such as a polyamide resin. Polyamides are generally derived from the polymerization of organic lactams having from 4 to 12 carbon atoms. In one aspect, the lactams are represented by the formula (VIII)

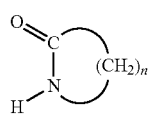

(VIII)

wherein n is 3 to 11. In one aspect, the lactam is epsilon-caprolactam having n equal to 5.

Polyamides can also be synthesized from amino acids having from 4 to 12 carbon atoms. In one aspect, the amino acids are represented by the formula (IX)

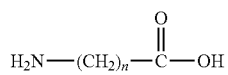

(IX)

wherein n is 3 to 11. In one aspect, the amino acid is epsilon-aminocaproic acid with n equal to 5.

Polyamides can also be polymerized from aliphatic dicarboxylic acids having from 4 to 12 carbon atoms and aliphatic diamines having from 2 to 12 carbon atoms. In one aspect, the aliphatic diamines are represented by the formula (X)

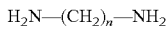

(X)

wherein n is about 2 to about 12. In one aspect, the aliphatic diamine is hexamethylenediamine ($H_2N(CH_2)_6NH_2$). In one aspect, the molar ratio of the dicarboxylic acid to the diamine is from 0.66 to 1.5. Within this range it is generally beneficial to have the molar ratio be greater than or equal to 0.81. In another aspect, the molar ratio is greater than or equal to 0.96. In yet another aspect, the molar ratio is less than or equal to 1.22. In still another aspect, the molar ratio is less than or equal to 1.04. Examples of polyamides that are useful in the present disclosure include, but are not limited to, nylon 6, nylon 6,6, nylon 4,6, nylon 6, 12, nylon 10, or the like, or combinations including at least one of the foregoing polyamides.

Synthesis of polyamideesters can also be accomplished from aliphatic lactones having from 4 to 12 carbon atoms and aliphatic lactams having from 4 to 12 carbon atoms. The ratio of aliphatic lactone to aliphatic lactam can vary widely depending on the selected composition of the final copolymer, as well as the relative reactivity of the lactone and the lactam. In one aspect, the initial molar ratio of aliphatic lactam to aliphatic lactone is 0.5 to 4. Within this range a molar ratio of greater than or equal to about 1 is beneficial. In another aspect, a molar ratio of less than or equal to 2 is utilized.

The conductive precursor composition can further include a catalyst or an initiator. Generally, any known catalyst or initiator suitable for the corresponding thermal polymerization can be used. Alternatively, the polymerization can be conducted without a catalyst or initiator. For example, in the synthesis of polyamides from aliphatic dicarboxylic acids and aliphatic diamines, no catalyst can be used in select aspects.

For the synthesis of polyamides from lactams, suitable catalysts include water and the omega-amino acids corresponding to the ring-opened (hydrolyzed) lactam used in the synthesis. Other suitable catalysts include metallic aluminum alkylates ($MAl(OR)_3H$; wherein M is an alkali metal or alkaline earth metal, and R is $C_1$-$C_{12}$ alkyl), sodium dihydrobis(2-methoxyethoxy)aluminate, lithium dihydrobis(tert-butoxy)aluminate, aluminum alkylates ($Al(OR)_2R$; wherein R is $C_1$-$C_{12}$ alkyl), N-sodium caprolactam, magnesium chloride or bromide salt of epsilon-caprolactam ($MgXC_6H_{10}NO$, X=Br or Cl), dialkoxy aluminum hydride. Suitable initiators include isophthaloybiscaprolactam, N-acetalcaprolactam, isocyanate epsilon-caprolactam adducts, alcohols (ROH; wherein R is $C_1$-$C_{12}$ alkyl), diols (HO—R—OH; wherein R is R is $C_1$-$C_{12}$ alkylene), omega-aminocaproic acids, and sodium methoxide.

For the synthesis of polyamideesters from lactones and lactams, suitable catalysts include metal hydride compounds, such as a lithium aluminum hydride catalysts having the formula $LiAl(H)_x(R^1)_y$, where x is 1 to 4, y is 0 to 3, x+y is equal to 4, and $R^1$ is selected from the group consisting of $C_1$-$C_{12}$ alkyl and $C_1$-$C_{12}$ alkoxy; highly beneficial catalysts include $LiAl(H)(OR^2)_3$, wherein $R^2$ is selected from $C_1$-$C_8$ alkyl; an especially beneficial catalyst is $LiAl(H)(OC(CH_3)_3)_3$. Other suitable catalysts and initiators include those described above for the polymerization of poly(epsilon-caprolactam) and poly(epsilon-caprolactone).

Poly(Arylene) Polymer

In yet another aspect, the thermoplastic compositions of the present disclosure include a poly(arylene ether) resin. As used herein, a "poly(arylene ether)" includes a plurality of structural units of the formula (XI):

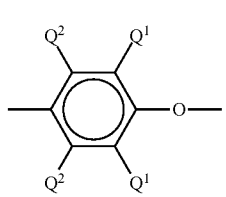

(XI)

wherein for each structural unit, each $Q^1$ is independently halogen, primary or secondary lower alkyl (e.g., an alkyl containing 1 to 7 carbon atoms), phenyl, haloalkyl, aminoalkyl, alkenylalkyl, alkynylalkyl, hydrocarbonoxy, and halohydrocarbonoxy wherein at least two carbon atoms separate the halogen and oxygen atoms; and each $Q^2$ is independently hydrogen, halogen, primary or secondary lower alkyl, phenyl, haloalkyl, aminoalkyl, alkenylalkyl, alkynylalkyl, hydrocarbonoxy, halohydrocarbonoxy wherein at least two carbon atoms separate the halogen and oxygen atoms. In some aspects, each $Q^1$ is independently alkyl or phenyl, for example, $C_{1-4}$ alkyl, and each $Q^2$ is independently hydrogen or methyl. The poly(arylene ether) can include molecules having aminoalkyl-containing end group(s), typically located in an ortho position to the hydroxy group. Also frequently present are 4-hydroxybiphenyl end groups, typically obtained from reaction mixtures in which a by-product diphenoquinone is present.

The poly(arylene ether) can be in the form of a homopolymer; a copolymer; a graft copolymer; an ionomer; a block copolymer, for example comprising arylene ether units and blocks derived from alkenyl aromatic compounds; as well as combinations comprising at least one of the foregoing. Poly(arylene ether) includes polyphenylene ether containing 2,6-dimethyl-1,4-phenylene ether units optionally in combination with 2,3,6-trimethyl-1,4-phenylene ether units.

The poly(arylene ether) can be prepared by the oxidative coupling of monohydroxyaromatic compound(s) such as 2,6-xylenol and/or 2,3,6-trimethylphenol. Catalyst systems are generally employed for such coupling; they can contain heavy metal compound(s) such as a copper, manganese or cobalt compound, usually in combination with various other materials such as a secondary amine, tertiary amine, halide or combination of two or more of the foregoing.

The poly(arylene ether) can have a number average molecular weight of 3,000 to 40,000 atomic mass units (amu) and a weight average molecular weight of 5,000 to 80,000 amu, as determined by gel permeation chromatography. The poly(arylene ether) can have an intrinsic viscosity of 0.10 to 0.60 deciliters per gram (dl/g), or, more specifically, 0.29 to 0.48 dl/g, as measured in chloroform at 25° C. It is possible to utilize a combination of high intrinsic viscosity poly(arylene ether) and a low intrinsic viscosity poly(arylene ether). Determining an exact ratio, when two intrinsic viscosities are used, will depend somewhat on the exact intrinsic viscosities of the poly(arylene ether) used and the ultimate physical properties that are selected.

Examples polyphenylene ether polymers that can be used in the present disclosure include, but are not limited to, poly(2,6-dimethyl-1,4-phenylene)ether; poly(2,3,6-trimethyl-1,4-phenylene)ether; poly(2,6-diethyl-1,4-phenylene)ether; poly(2-methyl-6-propyl-1,4-phenylene)ether; poly(2,6-dipropyl-1,4-phenylene)ether; poly(2-ethyl-6-propyl-1,4-phenylene)ether; poly(2,6-dilauryl-1,4-phenylene)ether; poly(2,6-diphenyl-1,4-phenylene)ether; poly(2,6-dimethoxy-1,4-phenylene)ether; poly(2,6-diethoxy-1,4-phenylene)ether; poly(2-methoxy-6-ethoxy-1,4-phenylene)ether; poly(2-ethyl-6-stearyloxy-1,4-phenylene)ether; poly(2,6-dichloro-1,4-phenylene)ether; poly(2-methyl-6-phenyl-1,4-phenylene)ether; poly(2,6-dibenzyl-1,4-phenylene)ether; poly(2-ethoxy-1,4-phenylene)ether; poly(2-chloro-1,4-phenylene)ether; poly(2,6-dibromo-1,4-phenylene)ether; poly(3-bromo-2,6-dimethyl-1,4-phenylene)ether, copolymers thereof and mixtures thereof, and the like. In select aspects, polyphenylene ether polymers for use in the compositions of the present disclosure include poly(2,6-dimethyl-1,4-phenylene)ether, poly(2,3,6-trimethyl-1,4-phenylene)ether, blends of these polymers and copolymers including units of 2,3,6-trimethyl-1,4-phenylene ether and units of 2,6-dimethyl-1,4-phenylene ether. Examples of such polymers and copolymers are also set forth in U.S. Pat. No. 4,806,297.

Polyphthalamide Polymer

In yet another aspect, the thermoplastic compositions of the present disclosure include a polyphthalamide resin. The polyphthalamide, in one aspect, includes the reaction product of (i) hexamethylene diamine or a mixture of hexamethylene diamine and trimethyl hexamethylene diamine, and (ii) terephthalic acid, and optionally (iii) at least one acid selected from isophthalic acid or adipic acid, provided that a mixture of the diamines is employed if reactant (iii) is absent. These polyphthalamides are generally crystalline in nature and exhibit improved tensile strength and high heat deflection temperatures. These polyphthalamides, and methods for their preparation, are disclosed in U.S. Pat. Nos. 4,603,166 and 4,617,342, and in European Patent Applications Nos. 121,983, 121,984, 121,985, 122,688 and 395,414.

For example, U.S. Pat. No. 4,603,166 and European Patent Application No. 121,984 disclose polyphthalamides prepared from hexamethylene diamine, terephthalic acid and adipic acid and from hexamethylene diamine, terephthalic acid, isophthalic acid and adipic acid. The hexamethylene diamine:terephthalic acid:isophthalic acid:adipic acid mole ratio employed therein is in the range of about 100:65-95:25-0:35-5. U.S. Pat. No. 4,617,342 and European Patent Application No. 122,688 disclose polyphthalamides formed from a mixture of hexamethylene diamine and trimethyl hexamethylene diamine in a molar ratio of from about 98:2 to about 60:4 and a mixture of terephthalic acid and isophthalic acid in a molar ratio of at least 80:20 to about 99:1. European Patent Application No. 121,985 discloses polyphthalamides prepared from a mixture of hexamethylene diamine and trimethyl hexamethylene diamine in a mole ratio of from about 55/45 to about 95/5 and terephthalic acid. The mole ratio of the terephthalic acid to the diamines is preferably in the range of 1.2:1 to 1:1.2, and more preferably about 1:1. European Patent Application No. 121,983 discloses polyphthalamides prepared from mixtures of hexamethylene diamine and trimethyl hexamethylene diamine and mixtures of terephthalic acid and adipic acid or mixtures of terephthalic acid, isophthalic acid and adipic acid. The mole ratio of hexamethylene diamine to trimethyl hexamethylene diamine is in the range of about 55/45 to about 98/2. When a mixture of terephthalic acid and adipic acid is employed, the mole ratio of the diamines, terephthalic acid and adipic acid is in the range of about 100/61/39 to 100/95/5. When the mixture of terephthalic acid, isophthalic acid and adipic acid is employed, the mole ratio of the diamines, terephthalic acid and a mixture of isophthalic acid and adipic acid is in the range of about 100/61/39 to 100/95/5, with the molar ratio of isophthalic acid to adipic acid in the mixture being about 38/1 to 1/38. Any of these crystalline polyphthalamides are suitable for use in the compositions of the present disclosure and can be prepared in accordance with the teachings of the aforementioned Poppe et al U.S. patents and the cited European patent applications.

High Rubber Graft Acrylonitrile-Butadiene-Styrene Copolymer

In various aspects, the blended thermoplastic compositions comprise a high rubber graft acrylonitrile-butadiene-styrene ("HRG ABS") polymer. HRG ABS polymers comprise greater than or equal to about 90% by weight SAN grafted onto polybutadiene, the remainder being free SAN. In some instances the free, ungrafted, SAN can be from 0 to 5 wt % of the HRG ABS composition. ABS can have butadiene contents between 12% and 85% by weight and styrene to acrylonitrile ratios between 90:10 and 60:40.

In a further aspect, at least about 30% by weight of the rigid polymeric phase is chemically bound or grafted to the rubbery polymeric phase. In a still further aspect, at least about 45% by weight of the rigid polymeric phase is chemically bound or grafted to the rubbery polymeric phase.

In a further aspect, the HRG ABS has rubber content greater than or equal to about 50 wt % by weight of the graft polymer. In a still further aspect, the HRG ABS has rubber content greater than or equal to about 60 wt % by weight of the graft polymer.

In a further aspect, the HRG ABS has rubber content less than or equal to about 95 wt % by weight of the graft polymer. In a still further aspect, the HRG ABS has rubber content less than or equal to about 90 wt % by weight of the graft polymer.

In various aspects, the high rubber graft impact modifier is in the form of a core-shell polymer built up from a rubber-like core on which one or more shells have been grafted. The core therefore consists substantially of an acrylate rubber or a butadiene rubber, and the shell(s) preferably comprise a vinylaromatic compound and/or a vinylcyanide and/or an alkyl (meth)acrylate. The core and/or the shell(s) often comprise multi-functional compounds that may act as a cross-linking agent and/or as a grafting agent. These polymers are usually prepared in several stages.

In a further aspect, the HRG ABS comprises about 8 wt % acrylonitrile, about 43 wt % butadiene, and about 49 wt % styrene. In a still further aspect, the HRG ABS comprises about 7 wt % acrylonitrile, about 50 wt % butadiene and about 43 wt % styrene. In a still further aspect, the HRG ABS comprises about 7 wt % acrylonitrile, about 69 wt % butadiene and about 24 wt % styrene. In an even further aspect, the HRG ABS comprise 11.1 wt. % acrylonitrile and about 38.5 wt. % styrene grafted to about 51 wt. % polybutadiene with a crosslink density of 43-55%.

In a further aspect, the HRG ABS has a mean particle size of about 100 microns to about 500 microns. In a still further aspect, the HRG ABS has a mean particle size of about 200 microns to about 400 microns. In a yet further aspect, the HRG ABS has a mean particle size of about 250 microns to about 350 microns. In an even further aspect, the HRG ABS has a mean particle size of about 200 microns to about 500 microns. In a still further aspect, the HRG ABS has a mean particle size of about 100 microns. In a yet further aspect, the HRG ABS has a mean particle size of about 150 microns. In an even further aspect, the HRG ABS has a mean particle size of about 200 microns. In a still further aspect, the HRG ABS has a mean particle size of about 250 microns. In a yet further aspect, the HRG ABS has a mean particle size of about 300 microns. In an even further aspect, the HRG ABS has a mean particle size of about 350 microns. In a still further aspect, the HRG ABS has a mean particle size of about 400 microns. In a yet further aspect, the HRG ABS has a mean particle size of about 450 microns. In an even further aspect, the HRG ABS has a mean particle size of about 500 microns.

In various aspects, the HRG ABS are prepared by graft polymerizing less than about 50 wt % of at least one rigid monomer such as a vinyl aromatic monomer, an acrylic monomer, a vinyl nitrile monomer or a mixture thereof in the presence of more than about 50 wt % of a preformed rubbery polydiene substrate such as 1,3-diene polymer or copolymer thereof. In particular, the graft copolymers comprise from 50 wt % to 90 wt % of a rubbery substrate polydiene such as for example polybutadiene or polyisoprene or a copolymer of a 1,3-diene with less than about 50 wt % of a copolymerizable vinyl or vinylidene monomer such as for example an olefin, a styrene monomer, a (meth)acrylate ester monomer or a (meth)acrylonitrile monomer, and from 10 to 50 wt % of a rigid graft phase formed from at least one rigid vinylidene or vinyl monomer selected from the group consisting of vinyl aromatic monomers, (meth)acrylic monomers, vinyl nitrile monomers and mixtures thereof.

In the preparation of the high rubber graft copolymers, either or both the rubbery or the rigid graft component may further include minor amounts, less than about 5 wt % of a copolymerization crosslinking monomer(s) such as di- or tri-functional monomer or combinations thereof to increase graft linking or/and crosslinking of either or both components. Preferably, crosslinking monomer(s) are absent. The high rubber graft copolymers can be prepared by conventional polymerization processes including emulsion, suspension, sequential emulsion-suspension, bulk and solution polymerization processes. These methods are known in the polymerization art, specifically directed toward the preparation of a wide variety of high rubber graft copolymers for impact modification of thermoplastic resins. Suitable specific embodiments of the particular impact modifiers can be prepared by any aforementioned polymerization means. The preferred polymerization processes are in aqueous media and include emulsion and suspension methods. The preferred process for preparing the rubbery portion is by way of emulsion polymerization as taught in the art.

The rubber forms the backbone of the graft polymer, and is a polymer of a conjugated diene having the formula (XI):

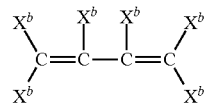

wherein $X^b$ is hydrogen, C—C alkyl, chlorine, or bromine. Examples of dienes that may be used are butadiene, isoprene, 1,3-hepta-diene, methyl-1,3-pentadiene, 2,3-dimethyl-1,3-butadiene, 2-ethyl-1,3-pentadiene; 1,3- and 2,4-hexadienes, chloro and bromo substituted butadienes such as dichlorobutadiene, bromobutadiene, dibromobutadiene, mixtures comprising at least one of the foregoing dienes, and the like. A preferred conjugated diene is butadiene. Copolymers of conjugated dienes with other monomers may also be used, for example copolymers of butadiene-styrene, butadiene-acrylonitrile, and the like.

Alternatively, the backbone may be an acrylate rubber, such as one based on n-butyl acrylate, ethylacrylate, 2-ethylhexylacrylate, mixtures comprising at least one of the foregoing, and the like. Additionally, minor amounts of a diene may be copolymerized in the acrylate rubber backbone to yield improved grafting.

After formation of the backbone polymer, a grafting monomer is polymerized in the presence of the backbone polymer. One preferred type of grafting monomer is a monovinylaromatic hydrocarbon having the formula (XII):

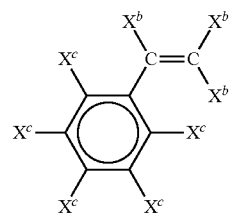

wherein $X^b$ is as defined above and $X^c$ is hydrogen, C1-C10 alkyl, C1-C10 cycloalkyl, C1-C10 alkoxy, C6-C18 alkyl, C6-C18 aralkyl, C6-C18 aryloxy, chlorine, bromine, and the like. Examples include styrene, 3-methylstyrene, 3,5-diethylstyrene, 4-n-propylstyrene, alpha-methylstyrene, alpha-methyl vinyltoluene, alpha-chlorostyrene, alpha-bromostyrene, dichlorostyrene, dibromostyrene, tetra-chlorostyrene, mixtures comprising at least one of the foregoing compounds, and the like. The preferred monovinylaromatic hydrocarbons are styrene and/or alpha-methylstyrene.

A second type of grafting monomer that may be polymerized in the presence of the polymer backbone are acrylic monomers of formula (XIII):

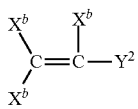

wherein $X^b$ is as previously defined and $Y^2$ is cyano, C1-C12 alkoxycarbonyl, or the like. Examples of such acrylic monomers include acrylonitrile, ethacrylonitrile, methacrylonitrile, alpha-chloroacrylonitrile, beta-chloroacrylonitrile, alpha-bromoacrylonitrile, beta-bromoacrylonitrile, methyl acrylate, methyl methacrylate, ethyl acrylate, butyl acrylate, propyl acrylate, isopropyl acrylate, mixtures comprising at least one of the foregoing monomers, and the like. Preferred monomers include acrylonitrile, ethyl acrylate, and methyl methacrylate.

A mixture of grafting monomers may also be used, to provide a graft copolymer. In various aspects, mixtures comprise a monovinylaromatic hydrocarbon and an acrylic monomer. In a further aspect, graft copolymers include acrylonitrile-butadiene-styrene (ABS) and methyl methacrylate-butadiene-styrene (MBS) resins. Suitable high-rubber acrylonitrile-butadiene-styrene resins are available from SABIC Innovative Plastics as under the trade names BLENDEX® grades 131, 336, 338, 360, and 415.

In a further aspect, the HRG ABS copolymer is present in an amount from about 12 wt % to about 21 wt %. In a still further aspect, the HRG ABS copolymer is present in an amount from about 13 wt % to about 20 wt %. In a yet further aspect, the HRG ABS copolymer is present in an amount from about 14 wt % to about 19 wt %. In an even further aspect, the HRG ABS copolymer is present in an amount of about 14 wt %. In a still further aspect, the HRG ABS copolymer is present in an amount of about 19 wt %.

Styrene-Acrylonitrile Copolymer

In various aspects, the blended thermoplastic compositions comprise a styrene-acrylonitrile copolymer ("SAN" or "SAN copolymer"). The SAN copolymer can be manufactured by bulk, suspension, or emulsion polymerization, and is substantially free of impurities, residual acids, residual bases or residual metals that may catalyze the hydrolysis of polycarbonate. In one aspect, the rigid copolymer is manufactured by bulk polymerization using a boiling reactor. SAN copolymers are described in ASTM D4203.

In various aspects, the content of the acrylonitrile monomer in the SAN copolymer is about 10 to about 50 wt %. In a further aspect, the acrylonitrile monomer in the SAN copolymer is about 20 wt % to about 30 wt %. In a still further aspect, the acrylonitrile monomer in the SAN copolymer is about 20 wt % to about 35 wt %. In a yet further aspect, the acrylonitrile monomer in the SAN copolymer is about 20 wt % to about 32 wt %. In an even further aspect, the acrylonitrile monomer in the SAN copolymer is about 22 wt % to about 30 wt %. %. In a still further aspect, the acrylonitrile monomer in the SAN copolymer is about 20 wt %. %. In a yet further aspect, the acrylonitrile monomer in the SAN copolymer is about 21 wt %. %. In an even further aspect, the acrylonitrile monomer in the SAN copolymer is about 22 wt %. %. In a still further aspect, the acrylonitrile monomer in the SAN copolymer is about 22 wt %. In a yet further aspect, the acrylonitrile monomer in the SAN copolymer is about 23 wt %. In an even further aspect, the acrylonitrile monomer in the SAN copolymer is about 24 wt %. In a still further aspect, the acrylonitrile monomer in the SAN copolymer is about 25 wt %. In a yet further aspect, the acrylonitrile monomer in the SAN copolymer is about 26 wt %. In an even further aspect, the acrylonitrile monomer in the SAN copolymer is about 27 wt %. In a still further aspect, the acrylonitrile monomer in the SAN copolymer is about 28 wt %. In a yet further aspect, the acrylonitrile monomer in the SAN copolymer is about 29 wt %. In an even further aspect, the acrylonitrile monomer in the SAN copolymer is about 30 wt %. In various further aspects, the acrylonitrile monomer in the SAN copolymer is at least about 15 wt %.

In a further aspect, the styrene monomer in the SAN copolymer is about 68 wt % to about 80 wt %. In a still further aspect, the styrene monomer in the SAN copolymer is about 70 wt % to about 78 wt %. In a yet further aspect, the styrene monomer in the SAN copolymer is about 72 wt % to about 78 wt %. In an even further aspect, the styrene monomer in the SAN copolymer is about 65 wt % to about 80 wt %. In a still further aspect, the styrene monomer in the SAN copolymer is about 65 wt %. In a yet further aspect, the styrene monomer in the SAN copolymer is about 66 wt %. In an even further aspect, the styrene monomer in the SAN copolymer is about 67 wt %. In a still further aspect, the styrene monomer in the SAN copolymer is about 68 wt %. In a yet further aspect, the styrene monomer in the SAN copolymer is about 69 wt %. In an even further aspect, the styrene monomer in the SAN copolymer is about 70 wt %. In a still further aspect, the styrene monomer in the SAN copolymer is about 72 wt %. In a yet further aspect, the styrene monomer in the SAN copolymer is about 73 wt %. In an even further aspect, the styrene monomer in the SAN copolymer is about 74 wt %.

In a further aspect, the weight average molecular weight of the SAN copolymer can be about 50,000 to about 250,000. In a still further aspect, the weight average molecular weight of the SAN copolymer can be about 30,000 to about 600,000. In a yet further aspect, the weight average molecular weight of the SAN copolymer can be about 50,000 to about 300,000. In an even further aspect, the weight average molecular weight of the SAN copolymer can be about 50,000 to about 200,000.

In a further aspect, the SAN copolymer is present in an amount from about 7 wt % to about 25 wt %. In a still further aspect, the SAN copolymer is present in an amount from about 10 wt % to about 25 wt %. In a yet further aspect, the SAN copolymer is present in an amount from about 12 wt % to about 22 wt %. In an even further aspect, the SAN copolymer is present in an amount from about 19 wt % to about 23 wt %. In a still further aspect, the SAN copolymer is present in an amount from about 11 wt % to about 14 wt %. In a yet further aspect, the SAN copolymer is present in an amount of about 22 wt %. In an even further aspect, the SAN copolymer is present in an amount of about 12 wt %.

Laser Direct Structuring Additive

In addition to the thermoplastic resin, the compositions of the present disclosure also include a laser direct structuring (LDS) additive. The LDS additive is selected to enable the composition to be used in a laser direct structuring process. In an LDS process, a laser beam exposes the LDS additive to place it at the surface of the thermoplastic composition and to activate metal atoms from the LDS additive. As such, the LDS additive is selected such that, upon exposed to a laser beam, metal atoms are activated and exposed and in areas not exposed by the laser beam, no metal atoms are exposed. In addition, the LDS additive is selected such that, after being exposed to laser beam, the etching area is capable of being plated to form conductive structure. As used herein "capable of being plated" refers to a material wherein a substantially uniform metal plating layer can be plated on laser-etched area and show a wide window for laser parameters. This process is different than laser marking wherein the main outcome of laser marking is a color change in the material under the effect of energy radiation. And the key characterization for laser marking is the contrast between the mark and the substrate.

Conversely, for LDS, the goal is the formation of metal seeds on the laser etched surface, and the final metallization layer during the following plating process. Plating rate and adhesion of plated layers are the key evaluation requirements. Color here means the substrate made from these materials itself not the color change under the laser radiation. As such, in addition to enabling the composition to be used in a laser direct structuring process, the LDS additive used in the present disclosure is also selected to help enable the composition to be colored while maintaining physical properties.

As previously discussed, current additives for LDS materials are usually spinel based metal oxides (such as copper chromium oxide), organic metal complexes (such as palladium/palladium-containing heavy metal complexes) or copper complexes there are some limitations based on these additives. However, spinel based metal oxides result in a black color. In addition, with organic metal complex, higher loadings are needed to obtain sufficiently dense nucleation for rapid metallization when activated, and these higher amounts adversely affect the mechanical properties of the materials.

Accordingly, the present disclosure utilizes LDS additives that enable coloring of the material while retaining mechanical strength of the composition. Examples of LDS additives useful in the present disclosure include, but are not limited to, a metal oxide-coated filler. In one aspect of the present disclosure, the LDS additive is antimony doped tin oxide coating on a mica substrate. Other examples include a coating including a copper containing metal oxide, a zinc containing metal oxide, a tin containing metal oxide, a magnesium containing metal oxide, an aluminum containing metal oxide, a gold containing metal oxide, a silver containing metal oxide, or a combination including at least one of the foregoing metal oxides, and the substrate can be any other mineral, such as silica.

The amount of the LDS additive included is sufficient to enable plating of the track formed after activation by the laser while not adversely affecting mechanical properties. In one aspect, the LDS additive is present in amounts of from 0.5 to 20 wt. %. In another aspect, the LDS additive is present in amounts from 1 to 15 wt. %. In still another aspect, the LDS additive is present in amounts from 3 to 10 wt. %.

As discussed, the LDS additive is selected such that, after activating with a laser, the conductive path can be formed by followed a standard electroless plating process. When the LDS additive is exposed to the laser, elemental metal is released. The laser draws the circuit pattern onto the part and leaves behind a roughened surface containing embedded metal particles. These particles act as nuclei for the crystal growth during a subsequent plating process, such as a copper plating process. Other electroless plating processes that can be used include, but are not limited to, gold plating, nickel plating, silver plating, zinc plating, tin plating or the like.

In addition to the thermoplastic resin, the LDS additive, and the optional colorant, the thermoplastic compositions of the present disclosure can include various additives ordinarily incorporated in resin compositions of this type. Mixtures of additives can be used. Such additives can be mixed at a suitable time during the mixing of the components for forming the composition. The one or more additives are included in the thermoplastic compositions to impart one or more selected characteristics to the thermoplastic compositions and any molded article made therefrom. Examples of additives that can be included in the present disclosure include, but are not limited to, heat stabilizers, process stabilizers, antioxidants, light stabilizers, plasticizers, antistatic agents, mold releasing agents, UV absorbers, lubricants, flow promoters or a combination of one or more of the foregoing additives. Any additive that would not adversely affect the colorability of the final composition can be included.

In various aspects, the laser direct structuring (LDS) additive is selected from a heavy metal mixture oxide spinel, a copper salt, or a combination including at least one of the foregoing laser direct structuring additives. In a further aspect, the laser direct structuring (LDS) additive comprises a combination of copper chromium oxide and at least one additional additive selected from a heavy metal mixture oxide spinel, or a copper salt.

In a further aspect, the laser direct structuring (LDS) additive comprises copper chromium oxide. In a still further aspect, the laser direct structuring (LDS) additive consists essentially of copper chromium oxide.

In a further aspect, the laser direct structuring (LDS) additive is present in an amount from about 8 wt % to about 12 wt %. In a still further aspect, the laser direct structuring (LDS) additive is present in an amount from about 9 wt % to about 11 wt %. In a yet further aspect, the laser direct structuring (LDS) additive is present in an amount of about 10 wt %.

Filler

In one aspect, the invention pertains to blended thermoplastic compositions, wherein the blended thermoplastic composition further comprises a mineral filler. In various aspects, the mineral filler is a silicate mineral filler. In a further aspect, the mineral filler is a talc. In a still further aspect, the talc is selected from a fibrous, modular, needle-shaped, or lamellar talc.

In various aspects, the mineral filler is a silicate and silica powder such as aluminum silicate (mullite), synthetic calcium silicate, zirconium silicate, fused silica, crystalline silica graphite, natural silica sand, or the like. In a further aspect, the mineral filler is a boron powder such as boron-nitride powder, boron-silicate powder, or the like. In a still further aspect, the mineral filler is an oxide such as $TiO_2$, aluminum oxide, magnesium oxide, or the like. In a yet further aspect, the mineral filler is a calcium sulfate (as its anhydride, dihydrate or trihydrate), or a calcium carbonate such as chalk, limestone, marble, synthetic precipitated calcium carbonates, or the like. In an even further aspect, the mineral filler is a talc, including fibrous, modular, needle shaped, lamellar talc, or the like. In a still further aspect, the mineral filler is a wollastonite, including, for example, surface-treated wollastonite. In a yet further aspect, the mineral filler is glass spheres such as hollow and solid glass spheres, silicate spheres, cenospheres, aluminosilicate (armospheres), or the like. In an even further aspect, the mineral filler is a kaolin, including hard kaolin, soft kaolin, calcined kaolin, kaolin comprising various coatings known in the art to facilitate compatibility with the polymeric matrix resin, or the like.

In various aspects, the mineral filler has an average particle size of less than or equal to about 5.0 micrometer. In a further aspect, the mineral filler has an average particle size of less than or equal to about 4.0 micrometers. In a still further aspect, the mineral filler has an average particle size of less than or equal to about 3.0 micrometers. In a yet further aspect, the mineral filler has an average particle size of less than or equal to about 2.5 micrometers. In an even further aspect, the mineral filler has an average particle size of less than or equal to about 2.0 micrometers.

In a further aspect, the mineral filler has an average largest dimension less than about 5.0 microns, a median particle size of less than 5.0 microns, or both. In a still further aspect, the mineral filler has an average largest dimension less than about 4.0 microns, a median particle size of less than 4.0 microns, or both. In a yet further aspect, the mineral filler has an average largest dimension less than about 3.0 microns, a median particle size of less than 3.0 microns, or both. In an even further aspect, the mineral filler has an average largest dimension less than about 2.5 microns, a median particle size of less than 2.5 microns, or both. In a still further aspect, the mineral filler has an average largest dimension less than about 2.0 microns, a median particle size of less than 2.0 microns, or both.

In a further aspect, the mineral filler has an average particle size of about 0.1 micron to about 5.0 micron. In a still further aspect, the mineral filler has an average particle size of about 0.1 micron to about 4.0 micron. In a yet further aspect, the mineral filler has an average particle size of about 0.1 micron to about 3.0 micron. In an even further aspect, the mineral filler has an average particle size of about 0.1 micron to about 2.5 micron. In a still further aspect, the mineral filler has an average particle size of about 0.1 micron to about 2.0 micron.

In various aspects, the mineral filler is talc having an average particle size of less than or equal to about 5.0 micrometer. In a further aspect, the mineral filler is talc having an average particle size of less than or equal to about 4.0 micrometers. In a still further aspect, the mineral filler is talc having an average particle size of less than or equal to about 3.0 micrometers. In a yet further aspect, the mineral filler is talc having an average particle size of less than or equal to about 2.5 micrometers. In an even further aspect, the mineral filler is talc having an average particle size of less than or equal to about 2.0 micrometers.

In a further aspect, the mineral filler is talc having an average largest dimension less than about 5.0 microns, a median particle size of less than 5.0 microns, or both. In a still further aspect, the mineral filler is talc having an average largest dimension less than about 4.0 microns, a median particle size of less than 4.0 microns, or both. In a yet further aspect, the mineral filler is talc having an average largest dimension less than about 3.0 microns, a median particle size of less than 3.0 microns, or both. In an even further aspect, the mineral filler is talc having an average largest dimension less than about 2.5 microns, a median particle size of less than 2.5 microns, or both. In a still further aspect, the mineral filler is talc having an average largest dimension less than about 2.0 microns, a median particle size of less than 2.0 microns, or both.

In a further aspect, the mineral filler is talc having an average particle size of about 0.1 micron to about 5.0 micron. In a still further aspect, the mineral filler is talc having an average particle size of about 0.1 micron to about 4.0 micron. In a yet further aspect, the mineral filler is talc having an average particle size of about 0.1 micron to about 3.0 micron. In an even further aspect, the mineral filler is talc having an average particle size of about 0.1 micron to about 2.5 micron. In a still further aspect, the mineral filler is talc having an average particle size of about 0.1 micron to about 2.0 micron.

In a further aspect, the mineral filler is present in an amount from abut 1 wt % to about 10 wt %. In a still further aspect, the mineral filler is present in an amount from about 2 wt % to about 9 wt %. In a yet further aspect, the mineral filler is present in an amount from about 2 wt % to about 8 wt %. In an even further aspect, the mineral filler is present in an amount from about 3 wt % to about 7 wt %. In a still further aspect, the mineral filler is present in an amount from about 3 wt % to about 6 wt %. In a yet further aspect, the mineral filler is present in an amount from about 3 wt % to about 5 wt %. In an even further aspect, the mineral filler is present in an amount of about 3 wt %. In a still further aspect, the mineral filler is present in an amount of about 5 wt %.

In a further aspect, the particle size of the mineral filler is less than or equal to about 5.0 µm. In a still further aspect, the particle size of the mineral filler is greater than or equal to about 0.1 µm. In a yet further aspect, the particle size is from about 0.1 µm to about 5.0 µm. In an even further aspect, the average particle size of the mineral filler is less than or equal to about 5.0 µm. In a still further aspect, the average particle size of the mineral filler is greater than or equal to about 0.1 µm. In a yet further aspect, the average particle size is from about 0.1 µm to about 5.0 µm. In an even further aspect, the median particle size of the mineral filler is less than or equal to about 5.0 µm. In a still further aspect, the median particle size of the mineral filler is greater than or equal to about 0.1 µm. In a yet further aspect, the median particle size is from about 0.1 µm to about 5.0 µm. In an even further aspect, a higher amount of the mineral filler results in a higher plating performance. In a still further aspect, a higher amount of the mineral filler results in a lower mechanical strength.

Other Additives

In addition to the polymer blend, the SAN copolymer, and the LDS additive, the blended thermoplastic compositions of the present invention may include various additives ordinarily incorporated in resin compositions of this type. Mixtures of additives may be used. Such additives may be mixed at a suitable time during the mixing of the components for forming the composition. The one or more additives are included in the thermoplastic compositions to impart one or more selected characteristics to the thermoplastic compositions and any molded article made therefrom. Examples of additives that may be included in the present invention include, but are not limited to, heat stabilizers, process stabilizers, antioxidants, light stabilizers, plasticizers, antistatic agents, mold releasing agents, UV absorbers, lubricants, flow promoters, impact modifiers or a combination of one or more of the foregoing additives.

In various aspects, the invention pertains to blended thermoplastic compositions, wherein the blended thermoplastic composition further comprises a mold release agent. In a further aspect, the mold release agent is present in an amount from about 0.01 wt % to about 0.5 wt %. In a still further aspect, the mold release agent is present in an amount of about 0.3 wt %.

In various aspects, the invention pertains to blended thermoplastic compositions, wherein the blended thermoplastic composition further comprises an anti-oxidant. In a further aspect, the anti-oxidant is a primary anti-oxidant. In a still further aspect, the anti-oxidant is a secondary anti-oxidant. In a yet further aspect, the anti-oxidant is present in an amount from about 0.01 wt % to about 0.5 wt %. In an even further aspect, the primary anti-oxidant is present in an amount from about 0.01 wt % to about 0.5 wt %. In a still further aspect, the secondary anti-oxidant is present in an amount from about 0.01 wt % to about 0.5 wt %. In a yet further aspect, the anti-oxidant is present in an amount of about 0.08 wt %. In an even further aspect, the primary anti-oxidant is present in an amount of about 0.08 wt %. In a still further aspect, the secondary anti-oxidant is present in an amount of about 0.08 wt %.

In various aspects, the invention pertains to blended thermoplastic compositions, wherein the blended thermoplastic composition further comprises a stabilizer. In a further aspect, the stabilizer is present in an amount from about 0.01 wt % to about 0.5 wt %. In a still further aspect, the stabilizer is present in an amount of about 0.08 wt %.

Suitable heat stabilizers include, for example, organo phosphites such as triphenyl phosphite, tris-(2,6-dimethylphenyl)phosphite, tris-(mixed mono- and di-nonylphenyl) phosphite or the like; phosphonates such as dimethylbenzene phosphonate or the like, phosphates such as trimethyl phosphate, or the like, or combinations including at least one of the foregoing heat stabilizers. Heat stabilizers are generally used in amounts of from 0.01 to 0.5 parts by weight based on 100 parts by weight of the total composition, excluding any filler.

Suitable antioxidants include, for example, organophosphites such as tris(nonyl phenyl)phosphite, tris(2,4-di-t-butylphenyl)phosphite, bis(2,4-di-t-butylphenyl)pentaerythritol diphosphite, distearyl pentaerythritol diphosphite or the like; alkylated monophenols or polyphenols; alkylated reaction products of polyphenols with dienes, such as tetrakis [methylene(3,5-di-tert-butyl-4-hydroxyhydrocinnamate)] methane, or the like; butylated reaction products of paracresol or dicyclopentadiene; alkylated hydroquinones; hydroxylated thiodiphenyl ethers; alkylidene-bisphenols; benzyl compounds; esters of beta-(3,5-di-tert-butyl-4-hydroxyphenyl)-propionic acid with monohydric or polyhydric alcohols; esters of beta-(5-tert-butyl-4-hydroxy-3-methylphenyl)-propionic acid with monohydric or polyhydric alcohols; esters of thioalkyl or thioaryl compounds such as distearylthiopropionate, dilaurylthiopropionate, ditridecylthiodipropionate, octadecyl-3-(3,5-di-tert-butyl-4-hydroxyphenyl)propionate, pentaerythrityl-tetrakis[3-(3,5-di-tert-butyl-4-hydroxyphenyl)propionate or the like; amides of beta-(3,5-di-tert-butyl-4-hydroxyphenyl)-propionic acid or the like, or combinations including at least one of the foregoing antioxidants. Antioxidants are generally used in amounts of from 0.01 to 0.5 parts by weight, based on 100 parts by weight of the total composition, excluding any filler.

Suitable light stabilizers include, for example, benzotriazoles such as 2-(2-hydroxy-5-methylphenyl)benzotriazole, 2-(2-hydroxy-5-tert-octylphenyl)-benzotriazole and 2-hydroxy-4-n-octoxy benzophenone or the like or combinations including at least one of the foregoing light stabilizers. Light stabilizers are generally used in amounts of from 0.1 to 1.0 parts by weight, based on 100 parts by weight of the total composition, excluding any filler.

Suitable plasticizers include, for example, phthalic acid esters such as dioctyl-4,5-epoxy-hexahydrophthalate, tris-(octoxycarbonylethyl) isocyanurate, tristearin, epoxidized soybean oil or the like, or combinations including at least one of the foregoing plasticizers. Plasticizers are generally used in amounts of from 0.5 to 3.0 parts by weight, based on 100 parts by weight of the total composition, excluding any filler.

Suitable antistatic agents include, for example, glycerol monostearate, sodium stearyl sulfonate, sodium dodecylbenzenesulfonate or the like, or combinations of the foregoing antistatic agents. In one aspect, carbon fibers, carbon nanofibers, carbon nanotubes, carbon black, or any combination of the foregoing can be used in a polymeric resin containing chemical antistatic agents to render the composition electrostatically dissipative.

Suitable mold releasing agents include for example, metal stearate, stearyl stearate, pentaerythritol tetrastearate, beeswax, montan wax, paraffin wax, or the like, or combinations including at least one of the foregoing mold release agents. Mold releasing agents are generally used in amounts of from 0.1 to 1.0 parts by weight, based on 100 parts by weight of the total composition, excluding any filler.

Suitable UV absorbers include for example, hydroxybenzophenones; hydroxybenzotriazoles; hydroxybenzotriazines; cyanoacrylates; oxanilides; benzoxazinones; 2-(2H-benzotriazol-2-yl)-4-(1,1,3,3-tetramethylbutyl)-phenol (CYASORB™ 5411); 2-hydroxy-4-n-octyloxybenzophenone (CYASORB™ 531); 2-[4,6-bis(2,4-dimethylphenyl)-1,3,5-triazin-2-yl]-5-(octyloxy)-phenol (CYASORB™ 1164); 2,2'-(1,4-phenylene)bis(4H-3,1-benzoxazin-4-one) (CYASORB™ UV-3638); 1,3-bis[(2-cyano-3,3-diphenylacryloyl) oxy]-2,2-bis[[(2-cyano-3, 3-diphenylacryloyl)oxy]methyl] propane (UVINUL™ 3030); 2,2'-(1,4-phenylene)bis(4H-3, 1-benzoxazin-4-one); 1,3-bis[(2-cyano-3,3-diphenylacryloyl)oxy]-2,2-bis[[(2-cyano-3,3-diphenylacryloyl)oxy]methyl]propane; nano-size inorganic materials such as titanium oxide, cerium oxide, and zinc oxide, all with particle size less than 100 nanometers; or the like, or combinations including at least one of the foregoing UV absorbers. UV absorbers are generally used in amounts of from 0.01 to 3.0 parts by weight, based on 100 parts by weight based on 100 parts by weight of the total composition, excluding any filler.

Suitable lubricants include for example, fatty acid esters such as alkyl stearyl esters, e.g., methyl stearate or the like; mixtures of methyl stearate and hydrophilic and hydrophobic surfactants including polyethylene glycol polymers, polypropylene glycol polymers, and copolymers thereof e.g., methyl stearate and polyethylene-polypropylene glycol copolymers in a suitable solvent; or combinations including at least one of the foregoing lubricants. Lubricants are generally used in amounts of from 0.1 to 5 parts by weight, based on 100 parts by weight of the total composition, excluding any filler.

Suitable blowing agents include for example, low boiling halohydrocarbons and those that generate carbon dioxide; blowing agents that are solid at room temperature and when heated to temperatures higher than their decomposition temperature, generate gases such as nitrogen, carbon dioxide, ammonia gas, such as azodicarbonamide, metal salts of azodicarbonamide, 4,4' oxybis(benzenesulfonylhydrazide), sodium bicarbonate, ammonium carbonate, or the like, or combinations including at least one of the foregoing blowing agents. Blowing agents are generally used in amounts of from 1 to 20 parts by weight, based on 100 parts by weight of the total composition, excluding any filler.

Suitable pigments include for example, inorganic pigments such as metal oxides and mixed metal oxides such as zinc oxide, titanium dioxides, iron oxides or the like; sulfides such as zinc sulfides, or the like; aluminates; sodium sulfo-silicates; sulfates and chromates; carbon blacks; zinc ferrites; ultramarine blue; Pigment Brown 24; Pigment Red 101; Pigment Yellow 119; organic pigments such as azos, di-azos, quinacridones, perylenes, naphthalene tetracarboxylic acids, flavanthrones, isoindolinones, tetrachloroisoindolinones, anthraquinones, anthanthrones, dioxazines, phthalocyanines, and azo lakes; Pigment Blue 60, Pigment Red 122, Pigment Red 149, Pigment Red 177, Pigment Red 179, Pigment Red 202, Pigment Violet 29, Pigment Blue 15, Pigment Green 7, Pigment Yellow 147 and Pigment Yellow 150, or combinations including at least one of the foregoing pigments. Pigments are generally used in amounts of from 1 to 10 parts by weight, based on 100 parts by weight based on 100 parts by weight of the total composition, excluding any filler.

Suitable dyes include, for example, organic dyes such as coumarin 460 (blue), coumarin 6 (green), nile red or the like; lanthanide complexes; hydrocarbon and substituted hydrocarbon dyes; polycyclic aromatic hydrocarbons; scintillation dyes (preferably oxazoles and oxadiazoles); aryl- or heteroaryl-substituted poly(2-8 olefins); carbocyanine dyes; phthalocyanine dyes and pigments; oxazine dyes; carbostyryl dyes; porphyrin dyes; acridine dyes; anthraquinone dyes; arylmethane dyes; azo dyes; diazonium dyes; nitro dyes; quinone imine dyes; tetrazolium dyes; thiazole dyes; perylene dyes, perinone dyes; bis-benzoxazolylthiophene (BBOT); and xanthene dyes; fluorophores such as anti-stokes shift dyes which absorb in the near infrared wavelength and emit in the visible wavelength, or the like; luminescent dyes such as 5-amino-9-diethyliminobenzo(a)phenoxazonium perchlorate; 7-amino-4-methylcarbostyryl; 7-amino-4-methylcoumarin; 3-(2'-benzimidazolyl)-7-N,N-diethylaminocoumarin; 3-(2'-benzothiazolyl)-7-diethylaminocoumarin; 2-(4-biphenylyl)-5-(4-t-butylphenyl)-1,3,4-oxadiazole; 2-(4-biphenyl)-6-phenylbenzoxazole-1,3; 2,5-Bis-(4-biphenylyl)-1,3,4-oxadiazole; 2,5-bis-(4-biphenylyl)-oxazole; 4,4'-bis-(2-butyloctyloxy)-p-quaterphenyl; p-bis(o-methylstyryl)-benzene; 5,9-diaminobenzo(a)phenoxazonium perchlorate; 4-dicyanomethylene-2-methyl-6-(p-dimethylaminostyryl)-4H-pyran; 1,1'-diethyl-2,2'-carbocyanine iodide; 3,3'-diethyl-4,4',5,5'-dibenzothiatricarbocyanine iodide; 7-diethylamino-4-methylcoumarin; 7-diethylamino-4-trifluoromethylcoumarin; 2,2'-dimethyl-p-quaterphenyl; 2,2-dimethyl-p-terphenyl; 7-ethylamino-6-methyl-4-trifluoromethylcoumarin; 7-ethylamino-4-trifluoromethylcoumarin; nile red; rhodamine 700; oxazine 750; rhodamine 800; IR 125; IR 144; IR 140; IR 132; IR 26; IR5; diphenylhexatriene; diphenylbutadiene; tetraphenylbutadiene; naphthalene; anthracene; 9,10-diphenylanthracene; pyrene; chrysene; rubrene; coronene; phenanthrene or the like, or combinations including at least one of the foregoing dyes. Dyes are generally used in amounts of from 0.1 to 5 parts by weight, based on 100 parts by weight of the total composition, excluding any filler.

Suitable colorants include, for example titanium dioxide, anthraquinones, perylenes, perinones, indanthrones, quinacridones, xanthenes, oxazines, oxazolines, thioxanthenes, indigoids, thioindigoids, naphthalimides, cyanines, xanthenes, methines, lactones, coumarins, bis-benzoxazolylthiophene (BBOT), napthalenetetracarboxylic derivatives, monoazo and disazo pigments, triarylmethanes, aminoketones, bis(styryl)biphenyl derivatives, and the like, as well as combinations including at least one of the foregoing colorants. Colorants are generally used in amounts of from 0.1 to 5 parts by weight, based on 100 parts by weight of the total composition, excluding any filler.

Additionally, materials to improve flow and other properties can be added to the composition, such as low molecular weight hydrocarbon resins. Particularly useful classes of low molecular weight hydrocarbon resins are those derived from petroleum $C_5$ to $C_9$ feedstock that are derived from unsaturated $C_5$ to $C_9$ monomers obtained from petroleum cracking. Non-limiting examples include olefins, e.g. pentenes, hexenes, heptenes and the like; diolefins, e.g. pentadienes, hexadienes and the like; cyclic olefins and diolefins, e.g. cyclopentene, cyclopentadiene, cyclohexene, cyclohexadiene, methyl cyclopentadiene and the like; cyclic diolefin dienes, e.g., dicyclopentadiene, methylcyclopentadiene dimer and the like; and aromatic hydrocarbons, e.g. vinyltoluenes, indenes, methylindenes and the like. The resins can additionally be partially or fully hydrogenated.

Methods of Improving Plating Performance of Blended Thermoplastic Compositions

In one aspect, the invention pertains to methods of improving plating performance of a blended thermoplastic composition, the method comprising the step of combining: a) a polymer blend comprising: i) a polycarbonate polymer in an amount from about 40 wt % to about 70 wt %; and ii) a high rubber graft acrylonitrile-butadiene-styrene (HRG-ABS) copolymer in an amount from about 10 wt % to about 25 wt %; b) a styrene-acrylonitrile (SAN) copolymer in an amount from about 5 wt % to about 30 wt %; and c) a laser direct structuring (LDS) additive in an amount from about 5 wt % to about 15 wt %; the blended thermoplastic composition is capable of being plated after being activated with a laser and exhibits a mechanical strength greater than about 400 J/m.

In a further aspect, the combining of the method is injection molding. In a still further aspect, the combining of the method is extrusion molding. In a yet further aspect, the step of combining further comprises combining a mineral filler with the polymer blend, SAN, and LDS additive. In an even further aspect, the mineral filler is a silicate mineral filler. In a still further aspect, the mineral filler is talc. In a yet further aspect, the particle size of the mineral filler is less than or equal to about 5.0 μm. In an even further aspect, the particle size of the mineral filler is greater than or equal to about 0.1 μm. In a still further aspect, the particle size is from about 0.1 μm to about 5.0 μm.

In a further aspect, the invention relates to methods of improving plating performance of a blended thermoplastic compostion, the method comprising the step of combining: a) a polymer blend comprising: i) a polycarbonate polymer in an amount from about 40 wt % to about 70 wt %; and ii) a high rubber graft acrylonitrile-butadiene-styrene (HRG-ABS) copolymer in an amount from about 10 wt % to about 25 wt %; b) a styrene-acrylonitrile (SAN) copolymer in an amount from about 5 wt % to about 30 wt %; c) a mineral filler in an amount from about 1 wt % to about 10 wt %; and d) a laser direct structuring (LDS) additive in an amount from about 5 wt % to about 15 wt %; the blended thermoplastic composition is capable of being plated after being activated with a laser and exhibits a mechanical strength greater than about 400 J/m.

In a further aspect, the invention relates to methods of improving plating performance of a blended thermoplastic compostion, the method comprising the step of combining: a) a polymer blend comprising: i) a polycarbonate polymer in an amount from about 40 wt % to about 70 wt %; and ii) a high rubber graft acrylonitrile-butadiene-styrene (HRG-ABS) copolymer in an amount from about 10 wt % to about 25 wt %; b) a styrene-acrylonitrile (SAN) copolymer in an amount from about 5 wt % to about 30 wt %; c) a mineral filler in an amount from about 1 wt % to about 10 wt %; and d) a laser direct structuring (LDS) additive in an amount from about 5 wt % to about 15 wt %; the composition is capable of being plated after being activated with a laser and exhibits a mechanical strength greater than about 400 J/m.

In a further aspect, the invention relates to methods of improving plating performance of a blended thermoplastic compostion, the method comprising the step of combining: a) a polymer blend comprising: i) a polycarbonate polymer in an amount from about 60 wt % to about 65 wt %; and ii) a high rubber graft acrylonitrile-butadiene-styrene (HRG-ABS) copolymer in an amount from about 12 wt % to about 20 wt %; b) a styrene-acrylonitrile (SAN) copolymer in an amount from about 10 wt % to about 25 wt %; c) a mineral filler comprising talc in an amount from about 2 wt % to about 6 wt %; and d) a laser direct structuring (LDS) additive comprising copper chromium oxide in an amount from about 9 wt % to about 11 wt %; the blended thermoplastic composition is capable of being plated after being activated with a laser and exhibits a mechanical strength greater than about 400 J/m.

In a further aspect, the invention relates to methods of improving plating performance of a blended thermoplastic compostion, the method comprising the step of combining: a) a polymer blend comprising: i) a polycarbonate polymer in an amount from about 42 wt % to about 50 wt %; and ii) a high rubber graft acrylonitrile-butadiene-styrene (HRG-ABS) copolymer in an amount from about 17 wt % to about 21 wt %; b) a styrene-acrylonitrile (SAN) copolymer in an amount from about 19 wt % to about 23 wt %; c) a talc in an amount from about 2 wt % to about 5 wt %; and d) a laser direct structuring (LDS) additive comprising copper chromium oxide in an amount from about 9 wt % to about 11 wt %; the blended thermoplastic composition is capable of being plated after being activated with a laser and exhibits a mechanical strength greater than about 400 J/m.

In a further aspect, the invention relates to methods of improving plating performance of a blended thermoplastic compostion, the method comprising the step of combining: a) a polymer blend comprising: i) a polycarbonate polymer in an amount of about 46 wt %; and ii) a high rubber graft acrylonitrile-butadiene-styrene (HRG-ABS) copolymer in an amount of 19 wt %; b) a styrene-acrylonitrile (SAN) copolymer in an amount of about 22 wt %; c) a talc in an amount of about 3 wt %; and d) a laser direct structuring (LDS) additive comprising copper chromium oxide in an amount of about 10 wt %; the composition is capable of being plated after being activated with a laser and exhibits a mechanical strength greater than about 400 J/m.

In a further aspect, the invention relates to methods of improving plating performance of a blended thermoplastic compostion, the method comprising the step of combining: a) a polymer blend comprising: i) a polycarbonate polymer in an amount of about 44 wt %; and ii) a high rubber graft acrylonitrile-butadiene-styrene (HRG-ABS) copolymer in an amount of 19 wt %; b) a styrene-acrylonitrile (SAN) copolymer in an amount of about 22 wt %; c) a talc in an amount of about 5 wt %; and d) a laser direct structuring (LDS) additive comprising copper chromium oxide in an amount of about 10 wt %; the blended thermoplastic composition is capable of being plated after being activated with a laser and exhibits a mechanical strength greater than about 400 J/m.

In a further aspect, the invention relates to methods of improving plating performance of a blended thermoplastic compostion, the method comprising the step of combining: a) a polymer blend comprising: i) a polycarbonate polymer in an amount of about 49 wt %; and ii) a high rubber graft acrylonitrile-butadiene-styrene (HRG-ABS) copolymer in an amount of 19 wt %; b) a styrene-acrylonitrile (SAN) copolymer in an amount of about 22 wt %; and c) a laser direct structuring (LDS) additive comprising copper chromium oxide in an amount of about 10 wt %; the blended thermoplastic composition is capable of being plated after being activated with a laser and exhibits a mechanical strength greater than about 400 J/m.

In a further aspect, the invention relates to methods of improving plating performance of a blended thermoplastic compostion, the method comprising the step of combining: a) a polymer blend comprising: i) a polycarbonate polymer in an amount of about 64 wt %; and ii) a high rubber graft acrylonitrile-butadiene-styrene (HRG-ABS) copolymer in an amount of 14 wt %; b) a styrene-acrylonitrile (SAN) copolymer in an amount of about 22 wt %; and c) a laser direct structuring (LDS) additive comprising copper chromium oxide in an amount of about 10 wt %; the blended thermoplastic composition is capable of being plated after being activated with a laser and exhibits a mechanical strength greater than about 400 J/m.

In a further aspect, the invention relates to methods of improving plating performance of a blended thermoplastic compostion, the method comprising the step of combining: a) a polymer blend comprising: i) a polycarbonate polymer in an amount of about 59 wt %; and ii) a high rubber graft acrylonitrile-butadiene-styrene (HRG-ABS) copolymer in an amount of 19 wt %; b) a styrene-acrylonitrile (SAN) copolymer in an amount of about 12 wt %; and c) a laser direct structuring (LDS) additive comprising copper chromium oxide in an amount of about 10 wt %; the composition is capable of being plated after being activated with a laser and exhibits a mechanical strength greater than about 400 J/m.

Methods of Manufacture

The blended thermoplastic compositions of the present disclosure can be formed using any known method of combining multiple components to form a thermoplastic resin. In one aspect, the components are first blended in a high-speed mixer. Other low shear processes including but not limited to hand mixing can also accomplish this blending. The blend is then fed into the throat of a twin-screw extruder via a hopper. Alternatively, one or more of the components can be incorporated into the composition by feeding directly into the extruder at the throat and/or downstream through a sidestuffer. The extruder is generally operated at a temperature higher than that necessary to cause the composition to flow. The extrudate is immediately quenched in a water batch and pelletized. The pellets so prepared when cutting the extrudate can be one-fourth inch long or less as desired. Such pellets can be used for subsequent molding, shaping, or forming.

In various aspects, the invention pertains to methods of forming an article, the method comprising the steps of: a) preparing a blended thermoplastic composition by combining: i) a polymer blend comprising: 1) a polycarbonate polymer in an amount from about 40 wt % to about 70 wt %; and 2) a high rubber graft acrylonitrile-butadiene-styrene (HRG-ABS) copolymer in an amount from about 10 wt % to about 25 wt %; ii) a styrene-acrylonitrile (SAN) copolymer in an amount from about 5 wt % to about 30 wt %; and iii) a laser direct structuring (LDS) additive in an amount from about 5 wt % to about 15 wt %; b) molding an article from the blended thermoplastic composition; c) using a laser to form a conductive path on the molded article; and d) plating a metal layer onto the conductive path; the molded article exhibits a mechanical strength greater than about 400 J/m.

In a further aspect, using a laser to form a conductive path is laser direct structuring. In a still further aspect, laser direct structuring comprises laser etching. In a yet further aspect, laser etching is carried out to provide an activated surface.

In a further aspect, laser etching is carried out at about 1 w to about 10 w power with a frequency from about 30 kHz to about 110 kHz and a speed of about 1 m/s to about 5 m/s. In a still further aspect, laser etching is carried out at about 1 w to about 10 w power with a frequency from about 40 kHz to about 100 kHz and a speed of about 2 m/s to about 4 m/s. In a yet further aspect, laser etching is carried out at about 3.5 w power with a frequency of about 40 kHz and a speed of about 2 m/s.

In a further aspect, plating a metal layer onto a conductive path is metallization. In a still further aspect, metallization comprises the steps: a) cleaning the etched surface; b) additive build-up of tracks; and c) plating.

In a further aspect, the metal layer is a copper layer. In a still further aspect, the metal layer has a thickness of about 0.8 micrometers or higher as measured according to ASTM B568.

Articles

Shaped, formed, or molded articles including the thermoplastic compositions are also provided. The thermoplastic compositions can be molded into useful shaped articles by a variety of means such as injection molding, extrusion, rotational molding, blow molding and thermoforming to form articles such as, for example, personal computers, notebook and portable computers, cell phone antennas and other such communications equipment, medical applications, RFID applications, automotive applications, and the like.

The blended thermoplastic compositions, or compounds, of disclosed herein provide robust plating performance while maintaining good mechanical properties (e.g., Izod impact strength higher than about 400 J/m). Evaluation of the mechanical properties can be performed through various tests, such as Izod test, Charpy test, Gardner test, etc., according to several standards (e.g., ASTM D256). Robustness of plating performance can be measured via a performance ranking, or plating ranking, ranging from top performance (e.g., "best") to bottom performance. The ranking can be partitioned in various levels. In one aspect, a plating ranking can have a level of "10" for top performance and a level of "0" for bottom performance.

In several aspects, the LDS compounds (or compositions) include a fixed loading amount (e.g., about 10 wt %) of an LDS additive, such as copper chromium oxide, and varying amounts of thermoplastic base resins. In such aspects, fixed loading amounts of a stabilizer, an antioxidant, and a mold release agent were maintained in the LDS compounds.

If bulk ABS is employed in blended PC/ABS based LDS compounds, the plating rank is 2, whereas utilization of a HRG type of ABS combined with styrene acrylonitrile (a copolymer of styrene and acrylonitrile referred to as SAN), to attain desired flow requirement(s), can yield a plating rank of about 4. It should be appreciated that other copolymers can be combined with the blended PC/ABS based LDS compounds of the disclosure. Without wishing to be bound by theory, modeling, and/or experiment, it is believed that such plating ranking increment can be due to presence of a large fraction of small rubber particles (e.g., rubber particles with dimensions of about 300 nm) in HRG ABS, wherein the rubber particles promote plating. The HRG ABS can be obtained by an emulsion method. It should be appreciated that in bulk ABS, there generally is a small fraction of larger rubber particles.

In one aspect, the invention relates to extruded or injection molded articles, the articles comprising the product of extrusion molding or injection molding a composition comprising: a) a polymer blend comprising: i) a polycarbonate polymer in an amount from about 40 wt % to about 70 wt %; and ii) a high rubber graft acrylonitrile-butadiene-styrene (HRG-ABS) copolymer in an amount from about 10 wt % to about 25 wt %; b) a styrene-acrylonitrile (SAN) copolymer in an amount from about 5 wt % to about 30 wt %; and c) a laser direct structuring (LDS) additive in an amount from about 5 wt % to about 15 wt %; the article is capable of being plated after being activated with a laser and exhibits a mechanical strength greater than about 400 J/m.

In a further aspect, the article is selected from a computer, a cell phone, communications equipment, a medical application, an RFID application, or an automotive application. In a still further aspect, the article further comprises a conductive path formed by activation with a laser. In a yet further aspect, the article further comprises a metal layer plated onto the conductive path. In an even further aspect, the metal layer is a copper layer. In a still further aspect, the metal layer has a thickness of about 0.8 micrometers or higher as measured according to ASTM B568.

In a further aspect, the invention relates to extruded or injection molded articles, the articles comprising the product of extrusion molding or injection molding a composition comprising: a) a polymer blend comprising: i) a polycarbonate polymer in an amount from about 40 wt % to about 70 wt %; and ii) a high rubber graft acrylonitrile-butadiene-styrene (HRG-ABS) copolymer in an amount from about 10 wt % to about 25 wt %; b) a styrene-acrylonitrile (SAN) copolymer in an amount from about 5 wt % to about 30 wt %; c) a mineral filler in an amount from about 1 wt % to about 10 wt %; and d) a laser direct structuring (LDS) additive in an amount from about 5 wt % to about 15 wt %; the article is capable of being plated after being activated with a laser and exhibits a mechanical strength greater than about 400 J/m.

In a further aspect, the invention relates to extruded or injection molded articles, the articles comprising the product of extrusion molding or injection molding a composition comprising: a) a polymer blend comprising: i) a polycarbonate polymer in an amount from about 60 wt % to about 65 wt %; and ii) a high rubber graft acrylonitrile-butadiene-styrene (HRG-ABS) copolymer in an amount from about 12 wt % to about 20 wt %; b) a styrene-acrylonitrile (SAN) copolymer in an amount from about 10 wt % to about 25 wt %; c) a mineral filler comprising talc in an amount from about 2 wt % to about 6 wt %; and d) a laser direct structuring (LDS) additive comprising copper chromium oxide in an amount from about 9 wt % to about 11 wt %; the article is capable of being plated after being activated with a laser and exhibits a mechanical strength greater than about 400 J/m.

In a further aspect, the invention relates to extruded or injection molded articles, the articles comprising the product of extrusion molding or injection molding a composition comprising: a) a polymer blend comprising: i) a polycarbonate polymer in an amount from about 42 wt % to about 50 wt %; and ii) a high rubber graft acrylonitrile-butadiene-styrene (HRG-ABS) copolymer in an amount from about 17 wt % to about 21 wt %; b) a styrene-acrylonitrile (SAN) copolymer in an amount from about 19 wt % to about 23 wt %; c) a talc in an amount from about 2 wt % to about 5 wt %; and d) a laser direct structuring (LDS) additive comprising copper chromium oxide in an amount from about 9 wt % to about 11 wt %; the article is capable of being plated after being activated with a laser and exhibits a mechanical strength greater than about 400 J/m.

In a further aspect, the invention relates to extruded or injection molded articles, the articles comprising the product of extrusion molding or injection molding a composition comprising: a) a polymer blend comprising: i) a polycarbonate polymer in an amount of about 46 wt %; and ii) a high rubber graft acrylonitrile-butadiene-styrene (HRG-ABS) copolymer in an amount of 19 wt %; b) a styrene-acrylonitrile (SAN) copolymer in an amount of about 22 wt %; c) a talc in an amount of about 3 wt %; and d) a laser direct structuring (LDS) additive comprising copper chromium oxide in an amount of about 10 wt %; the article is capable of being plated after being activated with a laser and exhibits a mechanical strength greater than about 400 J/m.

In a further aspect, the invention relates to extruded or injection molded articles, the articles comprising the product of extrusion molding or injection molding a composition comprising: a) a polymer blend comprising: i) a polycarbonate polymer in an amount of about 44 wt %; and ii) a high rubber graft acrylonitrile-butadiene-styrene (HRG-ABS) copolymer in an amount of 19 wt %; b) a styrene-acrylonitrile (SAN) copolymer in an amount of about 22 wt %; c) a talc in an amount of about 5 wt %; and d) a laser direct structuring (LDS) additive comprising copper chromium oxide in an amount of about 10 wt %; the article is capable of being plated after being activated with a laser and exhibits a mechanical strength greater than about 400 J/m.

In a further aspect, the invention relates to extruded or injection molded articles, the articles comprising the product of extrusion molding or injection molding a composition comprising: a) a polymer blend comprising: i) a polycarbonate polymer in an amount of about 49 wt %; and ii) a high rubber graft acrylonitrile-butadiene-styrene (HRG-ABS) copolymer in an amount of 19 wt %; b) a styrene-acrylonitrile (SAN) copolymer in an amount of about 22 wt %; and c) a laser direct structuring (LDS) additive comprising copper chromium oxide in an amount of about 10 wt %; the article is capable of being plated after being activated with a laser and exhibits a mechanical strength greater than about 400 J/m.

In a further aspect, the invention relates to extruded or injection molded articles, the articles comprising the product of extrusion molding or injection molding a composition comprising: a) a polymer blend comprising: i) a polycarbonate polymer in an amount of about 64 wt %; and ii) a high rubber graft acrylonitrile-butadiene-styrene (HRG-ABS) copolymer in an amount of 14 wt %; b) a styrene-acrylonitrile (SAN) copolymer in an amount of about 12 wt %; and c) a laser direct structuring (LDS) additive comprising copper chromium oxide in an amount of about 10 wt %; the article is capable of being plated after being activated with a laser and exhibits a mechanical strength greater than about 400 J/m.

In a further aspect, the invention relates to extruded or injection molded articles, the articles comprising the product of extrusion molding or injection molding a composition comprising: a) a polymer blend comprising: i) a polycarbonate polymer in an amount of about 59 wt %; and ii) a high rubber graft acrylonitrile-butadiene-styrene (HRG-ABS) copolymer in an amount of 19 wt %; b) a styrene-acrylonitrile (SAN) copolymer in an amount of about 12 wt %; and c) a laser direct structuring (LDS) additive comprising copper chromium oxide in an amount of about 10 wt %; the article is capable of being plated after being activated with a laser and exhibits a mechanical strength greater than about 400 J/m.

In various aspects, the invention relates to articles of manufacture comprising a molded article having a conductive path thereon; and a metal layer plated on the conductive path; the molded article is formed from a composition comprising: a) a polymer blend comprising: i) a polycarbonate polymer in an amount from about 40 wt % to about 70 wt %; and ii) a high rubber graft acrylonitrile-butadiene-styrene (HRG-ABS) copolymer in an amount from about 10 wt % to about 25 wt %; b) a styrene-acrylonitrile (SAN) copolymer in an amount from about 5 wt % to about 30 wt %; and c) a laser direct structuring (LDS) additive in an amount from about 5 wt % to about 15 wt %; the molded article exhibits a mechanical strength greater than about 400 J/m; and the LDS additive is activated with a laser.

In a further aspect, the metal layer of the article of manufacture comprises a copper layer. In a still further aspect, the metal layer has a thickness of 0.8 micrometers or higher as measured according to ASTM B568. In a yet further aspect, the article of manufacture is selected from a computer, a cell phone, communications equipment, a medical application, an REID application, or an automotive application.

EXAMPLES

The following examples are put forth so as to provide those of ordinary skill in the art with a complete disclosure and description of how the methods, devices, and systems disclosed and claimed herein are made and evaluated, and are intended to be purely exemplary and are not intended to limit the disclosure. Efforts have been made to ensure accuracy with respect to numbers (e.g., amounts, temperature, etc.), but some errors and deviations should be accounted for. Unless indicated otherwise, parts are parts by weight, temperature is in degrees Celsius (° C.) or is at ambient temperature, and pressure is at or near atmospheric.

There are numerous variations and combinations of reaction conditions, e.g., component concentrations, desired solvents, solvent mixtures, temperatures, pressures and other reaction ranges and conditions that can be used to optimize the product purity and yield obtained from the described process. Only reasonable and routine experimentation will be required to optimize such process conditions.

In one aspect, as illustrated in Table 1, which presents data that illustrate the effect of ABS type and SAN loading in exemplary compound of the disclosure, increasing HRG loading yields improved plating performance. In another aspect, increasing SAN loading yields improve plating performance of the final compounds (see Table 1). As illustrated in Table I, plating rank can reach a value of about 5 as HRG ABS and SAN loading are increased. It should be noted that prior to chemical plating, laser etching with optimized laser etching parameters (such as laser power of about 3.5 W, frequency 40 Hz, and speed of about 2 m/s) was applied to the exemplary compounds illustrated in Table I.

TABLE 1

Data illustrating effect of ABS type and SAN loading on plating performance of exemplary PC/ABS based LDS compounds in accordance with one or more aspects of the disclosure.

| Formulation | A | B | C | D |
|---|---|---|---|---|
| PC (w %) | 45 | 64 | 59 | 49 |
| HRG ABS (w %) |  | 14 | 19 | 19 |
| Bulk ABS (w %) | 44.54 |  |  |  |
| Bulk SAN (w %) |  | 11.54 | 11.54 | 21.54 |
| Copper chromium oxide (w %) | 10 | 10 | 10 | 10 |
| Stabilizer (w %) | 0.08 | 0.08 | 0.08 | 0.08 |
| Antioxidant (w %) | 0.08 | 0.08 | 0.08 | 0.08 |
| Mold release (w %) | 0.3 | 0.3 | 0.3 | 0.3 |
| Plating rank (10 being "best") | 2 | 4 | 4.5 | 5 |

In some aspects, addition of an amount of mineral filler, such as a silicate mineral filler (e.g., talc), into a composition can yield a LDS compound having a significantly improved plating performance (e.g., increased plating rate) while exhibiting good mechanical properties (e.g., Izod impact strength greater than about 400 J/m). For instance, addition of Talc in amounts ranging from about 3 wt % to about 5 wt % into LDS compounds can yield plating performance rank of 10, which represents a two-fold increase in plating performance when compared to LDS compounds not having talc. The mineral filler size can be relevant—even critical in some aspect—for adhesion of a plating layer. In one aspect, a beneficial size of the mineral filler can be in the range from about 0.1 µm to about 5.0 µm. In one aspect, compounds comprising a mineral filler (e.g., talc) can be plated well under a broad range of laser etching and chemical plating conditions. For example, laser etching parameters can be adjusted broadly (laser power from about 2 W to 9 W, frequency from about 40 KHz to 100 KHz, and speed from 2 m/s to 4 m/s) to achieve sufficient activated surface. Regarding plating, the LDS compounds having the mineral filler can permit generation of a plated surface with good adhesion in a short period of time.

Table 2 illustrates several exemplary compounds and the effect of addition of a mineral filler into the formulation of LDS compounds in accordance with aspects of the subject disclosure. As illustrated, the LDS compounds resulting from addition of the mineral filler exhibit performance plating with ranking of about 8 and about 10, with an Izod impact strength greater than 400 J/m.

TABLE 2

Data illustrating effect of mineral filler addition on plating performance of PC/ABS based LDS compounds in accordance with aspects of the disclosure.

| Formulation | D | E | F |
|---|---|---|---|
| PC (wt %) | 49 | 46 | 44 |
| HRG ABS (wt %) | 19 | 19 | 19 |
| Bulk ABS (wt %) | | | |
| Bulk SAN (wt %) | 21.54 | 21.54 | 21.54 |
| Copper chromium oxide (in wt %) | 10 | 10 | 10 |
| Talc (wt %) | | 3 | 5 |
| Stabilizer (wt %) | 0.08 | 0.08 | 0.08 |
| Antioxidant (wt %) | 0.08 | 0.08 | 0.08 |
| Mold release (wt %) | 0.3 | 0.3 | 0.3 |
| Plating rank (10 being "best") | 5 | 8 | 10 |
| Impact strength (J/m) | 639 | 550 | 440 |

Figure 2:
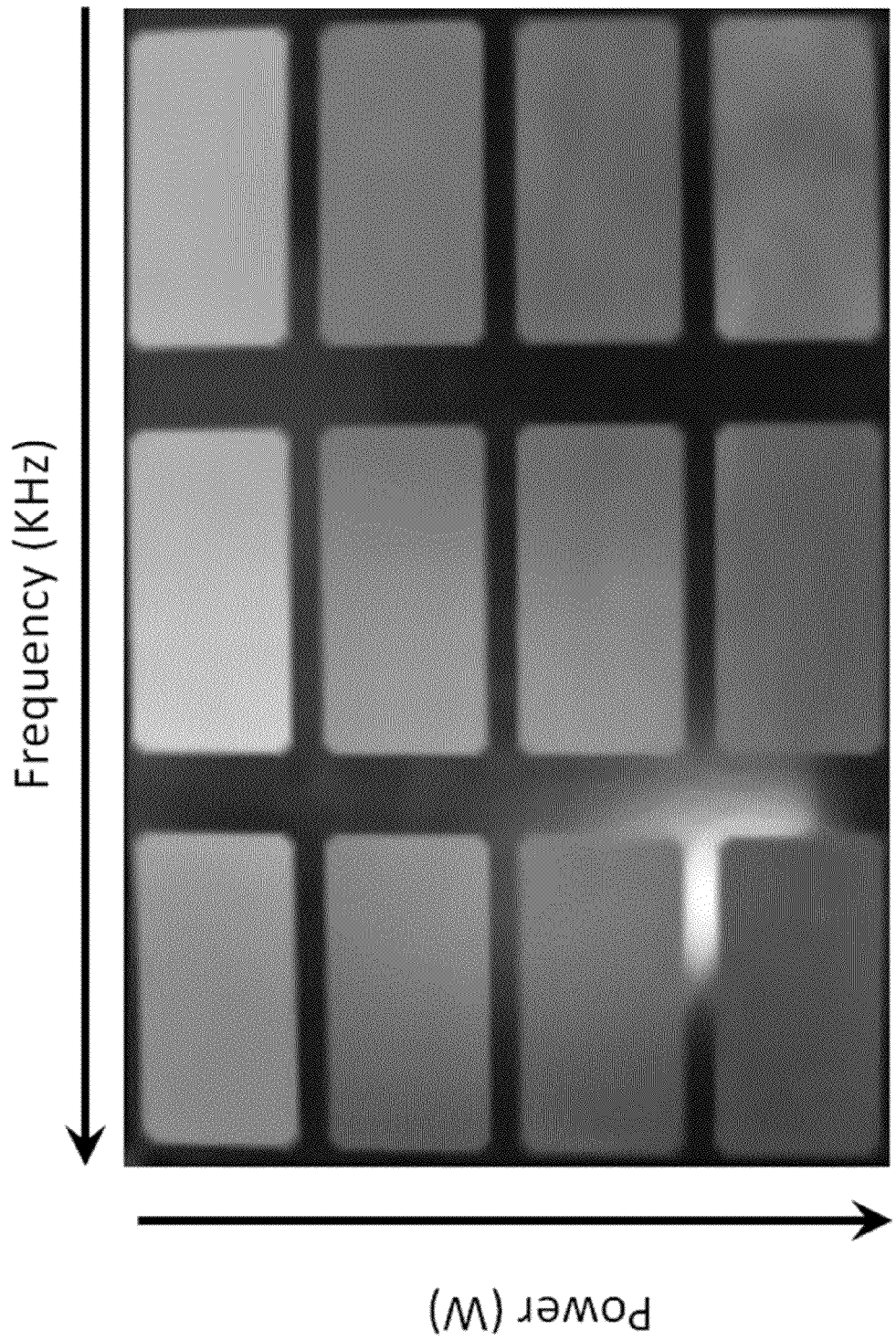
FIG. 2 shows representative data on the plating performance of representative compositions in accordance with one or more aspects of the disclosure. The representative samples at plated at varied at different conditions (frequency (f) and power (P)) as indicated by the arrows in the figure and the samples utilize a composition having a plating ranking equal to two.
Figure 3:
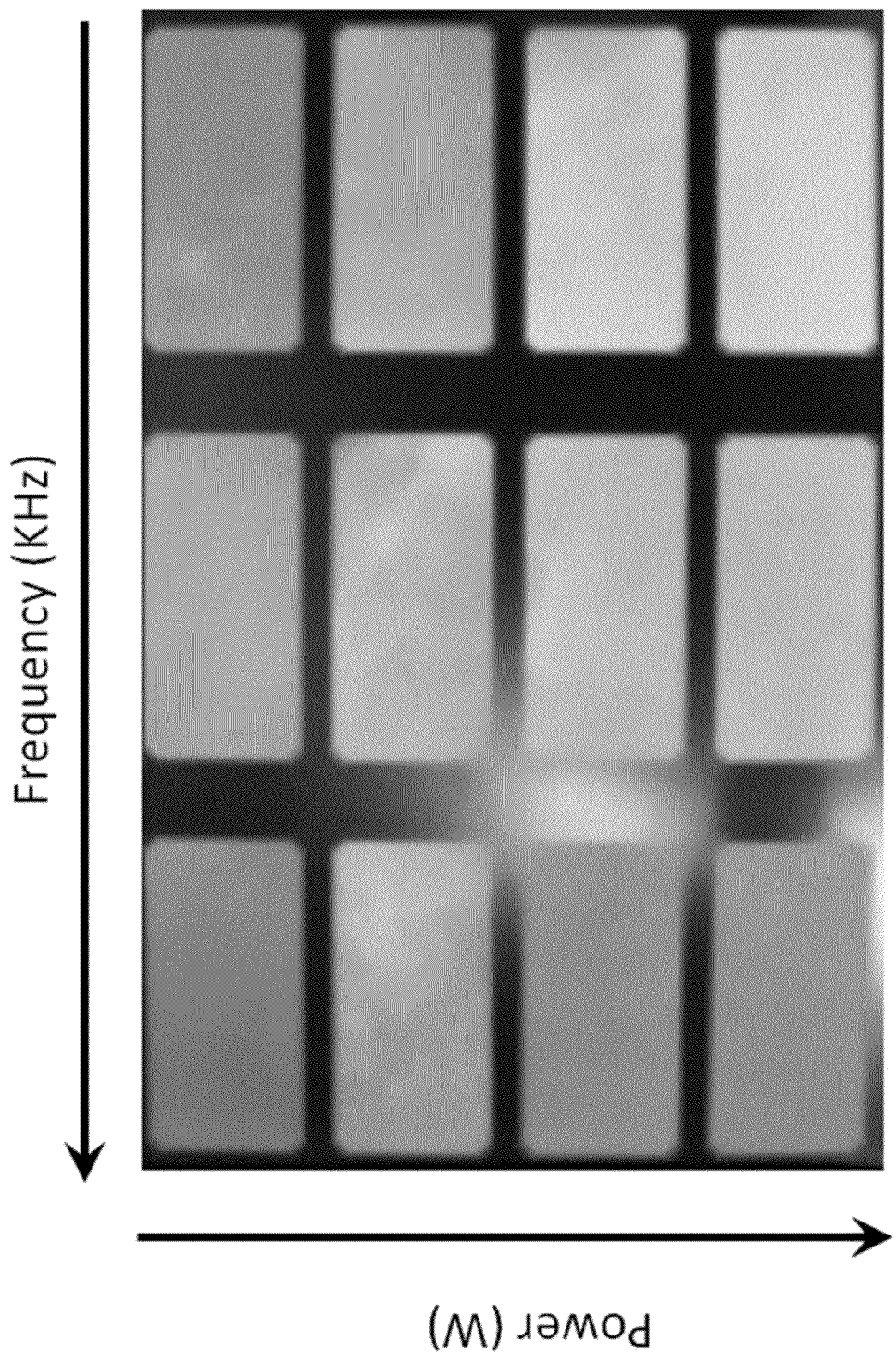
FIG. 3 shows representative data on the plating performance of representative compositions in accordance with one or more aspects of the disclosure. The representative samples at plated at varied at different conditions (frequency (f) and power (P)) as indicated by the arrows in the figure and the samples utilize a composition having a plating ranking equal to five.
Figure 4:
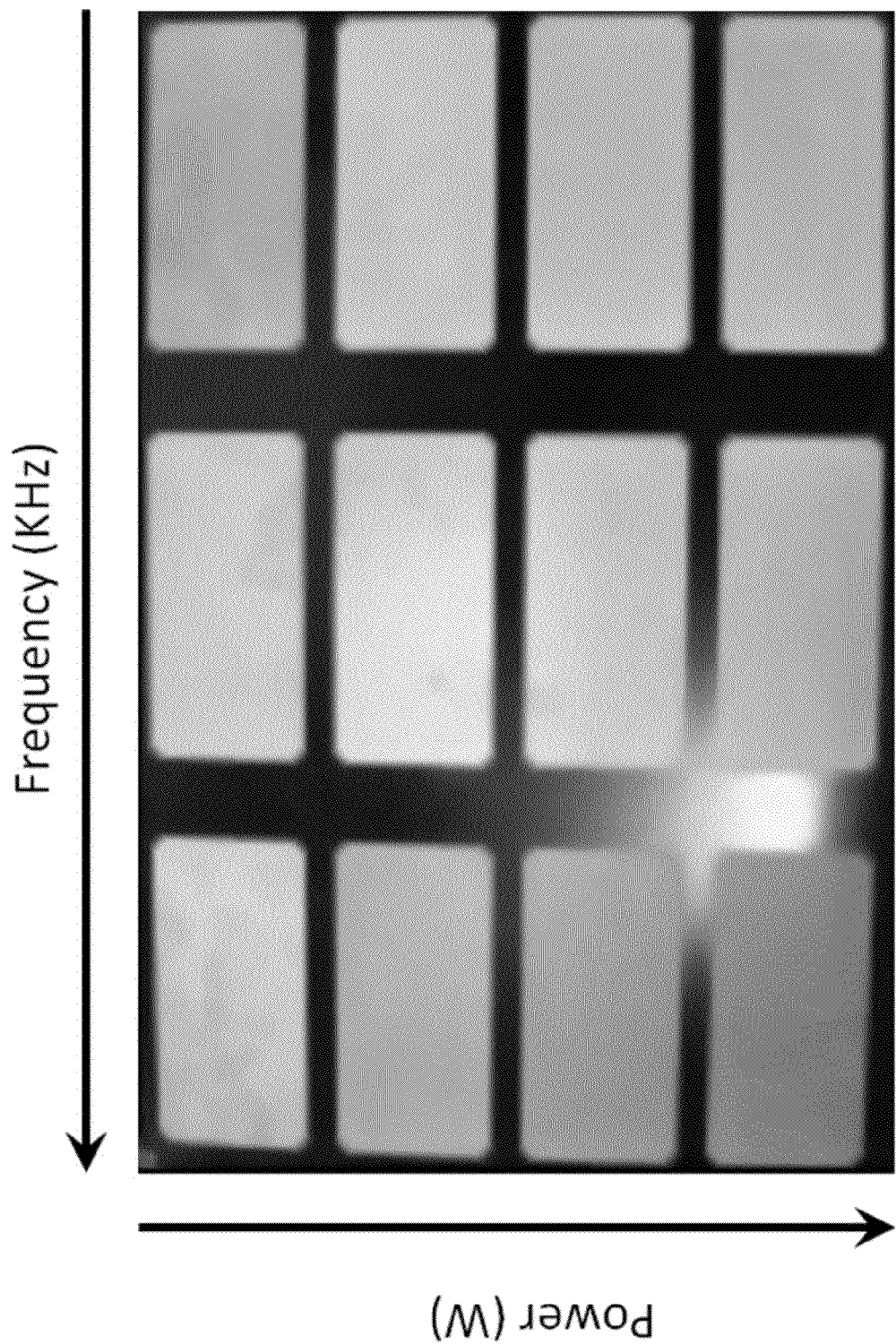
FIG. 4 shows representative data on the plating performance of representative compositions in accordance with one or more aspects of the disclosure. The representative samples at plated at varied at different conditions (frequency (f) and power (P)) as indicated by the arrows in the figure and the samples utilize a composition having a plating ranking equal to ten.

FIGS. 1-4 illustrates plating performance of the blended thermoplastic compositions in accordance with one or more aspects of the disclosure. Numbers shown in white color in each figure indicate the plating ranking of the illustrated samples based on the LDS compounds of the disclosure. Samples in each panel shown in each figure are arranged according to frequency (f) and power (P) employed for etching prior to plating. FIG. 1 presents exemplary samples plated at different conditions (e.g., f and P) for a compound having plating raking equal to zero. FIGS. 2-4 present exemplary samples plated after various etching procedures under different conditions (e.g., f and P) for compounds A, D, and F, respectively, as characterized in Table 2. Samples in FIGS. 2-4 have plating rakings equal to 2, 5, and 10, respectively.

It will be apparent to those skilled in the art that various modifications and variations can be made in the present invention without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A blended thermoplastic composition, comprising:
   a) a polymer blend comprising:
      i. a polycarbonate polymer in an amount from about 40 wt % to about 70 wt % based on the total weight of the blended thermoplastic composition; and
      ii. a high rubber graft acrylonitrile-butadiene-styrene (HRG-ABS) copolymer in an amount from about 10 wt % to about 25 wt % based on the total weight of the blended thermoplastic composition, wherein the HRG-ABS copolymer comprises rubber in an amount from about 50 wt % to about 85 wt % of the total weight of the HRG-ABS copolymer and styrene-acrylonitrile in an amount from about 15 wt % to about 50 wt % of the total weight of the HRG-ABS copolymer;
   b) a styrene-acrylonitrile (SAN) copolymer in an amount from about 5 wt. % to about 30 wt % based on the total weight of the blended thermoplastic composition, wherein the SAN copolymer comprises styrene in an amount from about 65 wt % to about 80 wt % of the total weight of the SAN copolymer;
   c) a talc in an amount from about 1 wt % to about 10 wt % based on the total weight of the blended thermoplastic composition; and
   d) a laser direct structuring (LDS) additive in an amount from about 5 wt % to about 15 wt % based on the total weight of the blended thermoplastic composition;
   wherein the composition is capable of being plated after being activated with a laser and exhibits a notched impact strength greater than about 400 J/m as measured at 23° C. according to ASTM D256; and
   wherein the combined weight percent value of all components does not exceed 100 wt % wherein at least 45% of the styrene-acrylonitrile in the composition is grafted to the rubber of the rubber component of the HRG-ABS.

2. The blended thermoplastic composition of claim 1, wherein polycarbonate polymer is present in an amount from about 44 wt % to about 49 wt %.

3. The blended thermoplastic composition of claim 1, wherein polycarbonate polymer is present in an amount of about 44 wt %.

4. The blended thermoplastic composition of claim 1, wherein polycarbonate polymer is present in an amount of about 49 wt %.

5. The blended thermoplastic composition of claim 1, wherein the HRG-ABS copolymer is present in an amount from about 12 wt % to about 20 wt %.

6. The blended thermoplastic composition of claim 1, wherein the HRG-ABS copolymer is present in an amount of about 14 wt %.

7. The blended thermoplastic composition of claim 1, wherein the HRG-ABS copolymer is present in an amount of about 19 wt %.

8. The blended thermoplastic composition of claim 1, wherein the SAN copolymer (b) is present in an amount from about 12 wt % to about 22 wt %.

9. The blended thermoplastic composition of claim 1, wherein the SAN copolymer (b) is present in an amount of about 12 wt %.

10. The blended thermoplastic composition of claim 1, wherein the SAN copolymer (b) is present in an amount of about 22 wt %.

11. The blended thermoplastic composition of claim 1, wherein the laser direct structuring (LDS) additive comprises copper chromium oxide.

12. The blended thermoplastic composition of claim 1, wherein the laser direct structuring (LDS) additive is present in an amount from about 8 wt % to about 12 wt %.

13. The blended thermoplastic composition of claim 1, wherein the laser direct structuring (LDS) additive is present in an amount of about 10 wt %.

14. The blended thermoplastic composition of claim 1, wherein the talc is present in an amount of about 3 wt %.

15. The blended thermoplastic composition of claim 1, wherein the talc is present in an amount of about 5 wt %.

16. The blended thermoplastic composition of claim 1, further comprising a mold release agent.

17. The blended thermoplastic composition of claim 16, wherein the mold release agent is present in an amount from about 0.01 wt % to about 0.5 wt %.

18. The blended thermoplastic composition of claim 1, further comprising an anti-oxidant.

19. The blended thermoplastic composition of claim 18, wherein the anti-oxidant is present in an amount from about 0.01 wt % to about 0.5 wt %.

20. The blended thermoplastic composition of claim 1, further comprising a stabilizer.

21. The blended thermoplastic composition of claim 20, wherein the stabilizer is present in an amount from about 0.01 wt % to about 0.5 wt %.

22. A blended thermoplastic composition, comprising:
  a) a polymer blend comprising:
    i. a polycarbonate polymer in an amount from about 40 wt % to about 70 wt % based on the total weight of the blended thermoplastic composition; and
    ii. a high rubber graft acrylonitrile-butadiene-styrene (HRG-ABS) copolymer in an amount from about 10 wt % to about 25 wt % based on the total weight of the blended thermoplastic composition, wherein the HRG-ABS copolymer comprises rubber in an amount from about 50 wt % to about 85 wt % of the total weight of the HRG-ABS copolymer and styrene-acrylonitrile in an amount from about 15 wt % to about 50 wt % of the total weight of the HRG-ABS copolymer;
  b) a styrene-acrylonitrile (SAN) copolymer in an amount from about 5 wt % to about 30 wt % based on the total weight of the blended thermoplastic composition, wherein the SAN copolymer comprises styrene in an amount from about 65 wt % to about 80 wt % of the total weight of the SAN copolymer;
  c) a talc in an amount from about 1 wt % to about 10 wt % based on the total weight of the blended thermoplastic composition; and
  d) a laser direct structuring (LDS) additive in an amount from about 5 wt % to about 15 wt % based on the total weight of the blended thermoplastic composition;
  wherein the composition is capable of being plated after being activated with a laser and exhibits a notched impact strength greater than about 400 J/m as measured at 23° C. according to ASTM D256; and
  wherein the combined weight percent value of all components does not exceed 100 wt % wherein at least 45% of the styrene-acrylonitrile in the composition is grafted to the rubber of the rubber component of the HRG-ABS.

23. A blended thermoplastic composition, comprising:
  a) a polymer blend comprising:
    i. a polycarbonate polymer in an amount of about 46 wt % based on the total weight of the blended thermoplastic composition; and
    ii. a high rubber graft acrylonitrile-butadiene-styrene (HRG-ABS) copolymer in an amount of 19 wt % based on the total weight of the blended thermoplastic composition, wherein the HRG-ABS copolymer comprises rubber in an amount from about 50 wt % to about 85 wt % of the total weight of the HRG-ABS copolymer and styrene-acrylonitrile in an amount from about 15 wt % to about 50 wt % of the total weight of the HRG-ABS copolymer;
  b) a styrene-acrylonitrile (SAN) copolymer in an amount of about 22 wt % based on the total weight of the blended thermoplastic composition, wherein the SAN copolymer comprises styrene in an amount from about 65 wt % to about 80 wt % of the total weight of the SAN copolymer;
  c) a talc in an amount of about 3 wt % based on the total weight of the blended thermoplastic composition; and
  d) a laser direct structuring (LDS) additive comprising copper chromium oxide in an amount of about 10 wt % based on the total weight of the blended thermoplastic composition;
  wherein the composition is capable of being plated after being activated with a laser and exhibits a notched impact strength greater than about 400 J/m as measured at 23° C. according to ASTM D256; and
  wherein the combined weight percent value of all components does not exceed 100 wt %.

24. A blended thermoplastic composition, comprising:
  a) a polymer blend comprising:
    i. a polycarbonate polymer in an amount of about 44 wt % based on the total weight of the blended thermoplastic composition; and
    ii. a high rubber graft acrylonitrile-butadiene-styrene (HRG-ABS) copolymer in an amount of 19 wt % based on the total weight of the blended thermoplastic composition, wherein the HRG-ABS copolymer comprises rubber in an amount from about 50 wt % to about 85 wt % of the total weight of the HRG-ABS copolymer and styrene-acrylonitrile in an amount from about 15 wt % to about 50 wt % of the total weight of the HRG-ABS copolymer;
  b) a styrene-acrylonitrile (SAN) copolymer in an amount of about 22 wt % based on the total weight of the blended thermoplastic composition, wherein the SAN copolymer comprises styrene in an amount from about 65 wt % to about 80 wt % of the total weight of the SAN copolymer;
  c) a talc in an amount of about 5 wt % based on the total weight of the blended thermoplastic composition; and
  d) a laser direct structuring (LDS) additive comprising copper chromium oxide in an amount of about 10 wt % based on the total weight of the blended thermoplastic composition;
  wherein the composition is capable of being plated after being activated with a laser and exhibits a notched impact strength greater than about 400 J/m as measured at 23° C. according to ASTM D256; and
  wherein the combined weight percent value of all components does not exceed 100 wt %.

25. A method of improving plating performance of a blended thermoplastic composition, the method comprising the step of combining:
  a) a polymer blend comprising:
    i. a polycarbonate polymer in an amount from about 40 wt % to about 70 wt % based on the total weight of the blended thermoplastic composition; and
    ii. a high rubber graft acrylonitrile-butadiene-styrene (HRG-ABS) copolymer in an amount from about 10 wt % to about 25 wt % based on the total weight of the blended thermoplastic composition, wherein the HRG-ABS copolymer comprises rubber in an amount from about 50 wt % to about 85 wt % of the total weight of the HRG-ABS copolymer and styrene-acrylonitrile in an amount from about 15 wt % to about 50 wt % of the total weight of the HRG-ABS copolymer;
  b) a styrene-acrylonitrile (SAN) copolymer in an amount from about 5 wt % to about 30 wt % based on the total weight of the blended thermoplastic composition, wherein the SAN copolymer comprises styrene in an amount from about 65 wt % to about 80 wt % of the total weight of the SAN copolymer;

c) a talc in an amount from about 1 wt % to about 10 wt % based on the total weight of the blended thermoplastic composition; and d) a laser direct structuring (LDS) additive in an amount from about 5 wt % to about 15 wt % based on the total weight of the blended thermoplastic composition;

wherein the blended thermoplastic composition is capable of being plated after being activated with a laser and exhibits a notched impact strength greater than about 400 J/m as measured at 23° C. according to ASTM D256; and wherein the combined weight percent value of all components does not exceed 100 wt % wherein at least 45 % of the styrene-acrylonitrile in the composition is grafted to the rubber of the rubber component of the HRG-ABS.

26. The method of claim 25, wherein combining is injection molding.

27. The method of claim 25, wherein combining is extrusion molding.

28. An extruded or injection molded article, comprising the product of extrusion molding or injection molding a composition comprising:

a) a polymer blend comprising:
i. a polycarbonate polymer in an amount from about 40 wt % to about 70 wt % based on the total weight of the composition; and
ii. a high rubber graft acrylonitrile-butadiene-styrene (HRG-ABS) copolymer in an amount from about 10 wt % to about 25 wt % based on the total weight of the composition, wherein the HRG-ABS copolymer comprises rubber in an amount from about 50 wt % to about 85 wt % of the total weight of the HRG-ABS copolymer and styrene-acrylonitrile in an amount from about 15 wt % to about 50 wt % of the total weight of the HRG-ABS copolymer;

b) a styrene-acrylonitrile (SAN) copolymer in an amount from about 5 wt % to about 30 wt % based on the total weight of the composition, wherein the SAN copolymer comprises styrene in an amount from about 65 wt % to about 80 wt % of the total weight of the SAN copolymer;

c) a talc in an amount from about 1 wt % to about 10 wt % based on the total weight of the blended thermoplastic composition; and d) a laser direct structuring (LDS) additive in an amount from about 5 wt % to about 15 wt % based on the total weight of the composition;

wherein the article is capable of being plated after being activated with a laser and exhibits a notched impact strength greater than about 400 J/m as measured at 23° C. according to ASTM D256; and wherein the combined weight percent value of all components does not exceed 100 wt % wherein at least 45 % of the styrene-acrylonitrile in the composition is grafted to the rubber of the rubber component of the HRG-ABS.

29. The article of claim 28, wherein the article is selected from a computer, a cell phone, communications equipment, a medical application, an RFID component, or an automotive component.

30. The article of claim 28, the article further comprising a conductive path formed by activation with a laser.

31. The article of claim 30, the article further comprising a metal layer plated onto the conductive path.

32. The article of claim 31, wherein the metal layer is a copper layer.

33. The article of claim 31, wherein the metal layer has a thickness of about 0.8 micrometers or higher as measured according to ASTM B568.

34. An article of manufacture comprising a molded article having a conductive path thereon; and a metal layer plated on the conductive path; wherein the molded article is formed from a composition comprising:

a) a polymer blend comprising:
i. a polycarbonate polymer in an amount from about 40 wt % to about 70 wt % based on the total weight of the composition; and
ii. a high rubber graft acrylonitrile-butadiene-styrene (HRG-ABS) copolymer in an amount from about 10 wt % to about 25 wt % based on the total weight of composition, wherein the HRG-ABS copolymer comprises rubber in an amount from about 50 wt % to about 85 wt % of the total weight of the HRG-ABS copolymer and styrene-acrylonitrile in an amount from about 15 wt % to about 50 wt % of the total weight of the HRG-ABS copolymer;

b) a styrene-acrylonitrile (SAN) copolymer in an amount from about 5 wt % to about 30 wt % based on the total weight of the composition, wherein the SAN copolymer comprises styrene in an amount from about 65 wt % to about 80 wt % of the total weight of the SAN copolymer;

c) a talc in an amount from about 1 wt % to about 10 wt % based on the total weight of the blended thermoplastic composition; and d) a laser direct structuring (LDS) additive in an amount from about 5 wt % to about 15 wt % based on the total weight of the composition;

wherein the molded article exhibits a notched impact strength greater than about 400 J/m as measured at 23° C. according to ASTM D256;

wherein the combined weight percent value of all components does not exceed 100 wt %; and wherein the LDS additive is activated with a laser wherein at least 45 % of the styrene-acrylonitrile in the composition is grafted to the rubber of the rubber component of the HRG-ABS.

35. The article of claim 34, wherein the metal layer comprises a copper layer.

36. The article of claim 34, wherein the metal layer has a thickness of 0.8 micrometers or higher as measured according to ASTM B568.

37. The article of claim 34, wherein the article is selected from a computer, a cell phone, communications equipment, a medical application, an RFID component, or an automotive component.

* * * * *